US012648279B2

(12) United States Patent
Lee et al.

(10) Patent No.: US 12,648,279 B2
(45) Date of Patent: Jun. 2, 2026

(54) DISPLAY DEVICE AND MANUFACTURING METHOD THEREOF

(71) Applicant: Samsung Display Co., LTD., Yongin-si (KR)

(72) Inventors: Sung Jin Lee, Yongin-si (KR); Won Tae Kim, Yongin-si (KR); Je Won Yoo, Yongin-si (KR); Yong Sik Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 684 days.

(21) Appl. No.: 17/972,310

(22) Filed: Oct. 24, 2022

(65) Prior Publication Data

US 2023/0130149 A1 Apr. 27, 2023

(30) Foreign Application Priority Data

Oct. 25, 2021 (KR) ........................ 10-2021-0142894

(51) Int. Cl.
*H10H 20/857* (2025.01)
*H01L 25/16* (2023.01)
*H10H 20/01* (2025.01)

(52) U.S. Cl.
CPC ......... *H10H 20/857* (2025.01); *H01L 25/167* (2013.01); *H10H 20/0364* (2025.01)

(58) Field of Classification Search
CPC ............. H10H 20/857; H10H 20/0364; H10H 20/813; H10H 20/83; H01L 25/0753; H01L 25/167; H10D 86/441
See application file for complete search history.

(56) References Cited

U.S. PATENT DOCUMENTS

| | | | |
|---|---|---|---|
| 8,587,194 B2 | 11/2013 | Lee et al. | |
| 11,380,664 B2 | 7/2022 | Lee et al. | |
| 2020/0403029 A1* | 12/2020 | Kim | H01L 25/0753 |
| 2021/0043616 A1* | 2/2021 | Jung | H10H 20/01 |
| 2021/0050325 A1* | 2/2021 | Kim | H10H 20/84 |

(Continued)

FOREIGN PATENT DOCUMENTS

| | | |
|---|---|---|
| KR | 10-2010-0135141 A | 12/2010 |
| KR | 10-2020-0042075 A | 4/2020 |

(Continued)

OTHER PUBLICATIONS

International Search Report dated Feb. 6, 2023 for corresponding PCT Application No. PCT/KR2022/016174 (3 pages).

*Primary Examiner* — Victor A Mandala
(74) *Attorney, Agent, or Firm* — Womble Bond Dickinson (US) LLP

(57) ABSTRACT

According to one or more embodiments of the present disclosure, a display device including a first extension area and a second extension area, the display device including: a first electrode and a second electrode on a substrate and spaced from each other in a first direction; and a first light emitting element on the first electrode and the second electrode, wherein: the first extension area extends in the first direction and includes a separation area in which the first electrode is not located, and the second extension area extends in a second direction crossing the first direction, the second extension area being an area in which the first electrode and the second electrode are not located.

11 Claims, 22 Drawing Sheets

(56) References Cited

U.S. PATENT DOCUMENTS

| | | | | |
|---|---|---|---|---|
| 2021/0057610 A1* | 2/2021 | Yang | ..................... | H10K 59/353 |
| 2021/0111303 A1 | 4/2021 | Lee et al. | | |
| 2021/0202803 A1* | 7/2021 | Park | ..................... | H10H 20/832 |
| 2021/0242381 A1 | 8/2021 | Lee et al. | | |
| 2021/0288220 A1* | 9/2021 | Oh | ......................... | H01L 25/167 |
| 2021/0327862 A1* | 10/2021 | Bae | ..................... | H10H 20/853 |
| 2021/0399069 A1* | 12/2021 | Kim | ......................... | H10K 59/88 |
| 2022/0052033 A1* | 2/2022 | Lee | ..................... | H10H 20/857 |
| 2022/0077245 A1* | 3/2022 | Lee | ..................... | H10H 20/857 |
| 2022/0393071 A1 | 12/2022 | Moon et al. | | |

FOREIGN PATENT DOCUMENTS

| | | |
|---|---|---|
| KR | 10-2021-0095774 A | 8/2021 |
| KR | 10-2021-0098313 A | 8/2021 |
| KR | 10-2021-0109699 A | 9/2021 |
| WO | WO 2021/091062 A1 | 5/2021 |

* cited by examiner

ELL

SEC2

AL

INF

SEC1

EP1

PXL 122  162  UAEL1  LD  146  144

142

CNT1                                                    CNT2

EP2                                                      EP1

ELT1                                                    ELT2

CNE1                                                    BNK

CNE2

EMA

124

BAEL1            164

DR2
DR3  DR1

$120\begin{cases}122\\124\end{cases}$ $140\begin{cases}142\\144\\146\end{cases}$ $160\begin{cases}162\\164\end{cases}$

FIG. 15

BELT

SUB/PCL

IV'

IV

DR1
DR3
DR2

DISPLAY DEVICE AND MANUFACTURING METHOD THEREOF

CROSS-REFERENCE TO RELATED APPLICATION

This application claims priority to and the benefit of Korean Patent Application No. 10-2021-0142894 filed in the Korean Intellectual Property Office on Oct. 25, 2021, the entire content of which is incorporated by reference herein.

BACKGROUND

1. Field

The present disclosure relates to a display device and a manufacturing method thereof.

2. Description of the Related Art

Recently, as interest in information display is increasing, research and development on display devices are continuously made.

SUMMARY

Aspects and features of embodiments of the present disclosure are to provide a display device capable of simplifying a subsequent inspection process, and a manufacturing method thereof.

Another aspect of the present disclosure is to provide a display device that prevents short defects between electrodes for aligning light emitting elements, and a manufacturing method thereof.

The aspects of the present disclosure are not limited to the aspects mentioned above, and other technical aspects that are not mentioned may be clearly understood to a person of an ordinary skill in the art using the following description.

According to one or more embodiments of the present disclosure, a display device including a first extension area and a second extension area, the display device including: a first electrode and a second electrode on a substrate and spaced from each other in a first direction; and a first light emitting element on the first electrode and the second electrode, wherein the first extension area extends in the first direction and includes a separation area in which the first electrode is not located, and the second extension area extends in a second direction crossing the first direction, the second extension area being an area in which the first electrode and the second electrode are not located.

According to one or more embodiments, the first extension area includes a plurality of first extension areas, the second extension area includes a plurality of second extension areas, and the first extension area and the second extension area may overlap in an overlapping area when viewed in a plan view, and may form a lattice structure using the overlapping area as a lattice point.

According to one or more embodiments, the first extension area may include a 1-1-th extension area and a 1-2-th extension area, the first electrode may be located between the 1-1-th extension area and the 1-2-th extension area, and the second electrode may overlap the first-first extension area and the first-second extension area when viewed in a plan view.

According to one or more embodiments, the second extension area may include a 2-1-th extension area, a 2-2-th extension area, and a 2-3-th extension area, the 2-3-th extension area may be located between the 2-1-th extension area and the 2-2-th extension area, the first electrode may be located between the 2-1-th extension area and the 2-3-th extension area, and the second electrode may be located between the 2-2-th extension area and the 2-3-th extension area.

According to one or more embodiments, the display device may further include an upper adjacent electrode spaced from the first electrode in the second direction with the separation area interposed therebetween, wherein the upper adjacent electrode is not located in the first extension area and the second extension area.

According to one or more embodiments, the display device may further include a first pixel area, a second pixel area, and a third pixel area in which the first light emitting element is located, wherein the first pixel area from which a first color is emitted, the second pixel area from which a second color is emitted, and the third pixel area from which a third color is emitted, and wherein the first extension area overlaps the first pixel area, the second pixel area, and the third pixel area in the first direction.

According to one or more embodiments, at least a portion of the second extension area may overlap the first pixel area, the second pixel area, and the third pixel area in a plan view.

According to one or more embodiments, the display device may further include a third electrode on the substrate and spaced from the second electrode in the first direction; a fourth electrode on the substrate and spaced from the third electrode in the first direction; and a second light emitting element located on the third electrode and the fourth electrode, wherein the fourth electrode is not located in the first extension area and the second extension area, and the third electrode overlaps the first extension area and is not located in the second extension area when viewed in a plan view.

According to one or more embodiments, the display device may further include a first contact electrode electrically connecting the first electrode and the first light emitting element; a second contact electrode electrically connecting the second electrode and the first light emitting element, and electrically connecting the fourth electrode and the second light emitting element; and a third contact electrode electrically connecting the third electrode and the second light emitting element.

According to one or more embodiments, the display device may further include a color conversion unit including a wavelength conversion pattern configured to change a wavelength of light, and defining the first pixel area, the second pixel area, and the third pixel area.

According to one or more embodiments of the present disclosure, a manufacturing method of a display device includes: forming a base electrode on a substrate; etching the base electrode; and arranging a light emitting element on the substrate, wherein the etching the base electrode includes: providing a first electrode and a second electrode spaced from the first electrode in a first direction; and forming a first extension area extending in the first direction and a second extension area extending in a second direction crossing the first direction, wherein the first extension area includes a separation area in which the first electrode is not located, and the second extension area is an area in which the first electrode and the second electrode are not located.

According to one or more embodiments, the etching the base electrode may include: forming a lattice structure by overlapping the first extension area and the second extension area in a plurality of overlapping areas.

According to one or more embodiments, the forming the first extension area and the forming the second extension area may be performed at the same time as each other.

According to one or more embodiments, the providing the first electrode and the second electrode may be performed at the same time as the forming the first extension area and the second extension area.

According to one or more embodiments, at least a portion of the second electrode may overlap the first extension area.

According to one or more embodiments, the etching the base electrode may further include forming an upper adjacent electrode spaced from the first electrode in the second direction with the separation area interposed therebetween.

According to one or more embodiments, the method may further include forming a bank protruding in a thickness direction of the substrate on the substrate, wherein the forming the bank is performed after the etching the base electrode.

According to one or more embodiments, the arranging the light emitting element may include: providing an ink including the light emitting element on the substrate; and forming an electric field between the first electrode and the second electrode.

According to one or more embodiments, the method may further include forming a first contact electrode electrically connecting the first electrode and the light emitting element; and forming a second contact electrode electrically connecting the second electrode and the light emitting element.

According to one or more embodiments of the present disclosure, a manufacturing method of a display device including a pixel area, includes: forming a base electrode on a substrate; providing a first electrode and a second electrode by etching the base electrode; and arranging a light emitting element on the first electrode and the second electrode, wherein the forming the base electrode includes providing a first extension area extending in a first direction and a second extension extending in a second direction crossing the first direction by being etched to be around at least a portion of the pixel area.

Aspects and features of the present disclosure are not limited to the above-described aspects and features, and aspects and features not mentioned will be clearly understood by those of ordinary skill in the art to which the present disclosure belongs from the present specification and the accompanying drawings.

According to one or more embodiments of the present disclosure, a display device capable of simplifying a subsequent inspection process and a manufacturing method thereof may be provided.

According to one or more embodiments of the present disclosure, a display device in which a short defect between electrodes for aligning a light emitting element is prevented and a manufacturing method thereof may be provided.

The effects, aspects, and features of the present disclosure are not limited to the above-described effects, aspects, and features, and the effects, aspects, and features not mentioned will be clearly understood by those of ordinary skill in the art to which the present disclosure belongs from the present specification and accompanying drawings.

BRIEF DESCRIPTION OF THE DRAWINGS

FIGS. 1 and 2 are perspective and cross-sectional views illustrating a light emitting element according to one or more embodiments.

FIGS. 14 to 22 are cross-sectional views illustrating a manufacturing method of a display device according to one or more embodiments.

DETAILED DESCRIPTION

Figure 1:
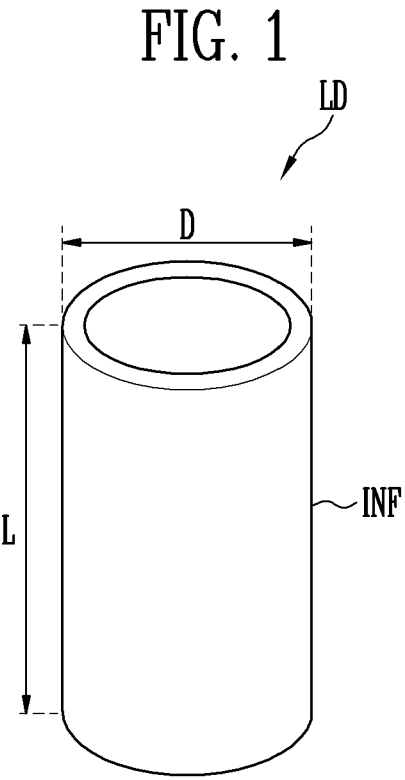

The embodiments described in this specification are for clearly explaining the spirit of the present disclosure to those of ordinary skill in the art to which the present disclosure belongs, so the present disclosure is not limited by the embodiments described herein, and the scope of the present disclosure should be interpreted as including modifications or variations that do not depart from the spirit or scope of the present disclosure.

The terms used in the present specification have been selected as widely used general terms as possible in consideration of the functions in the present disclosure, but they may vary depending on the intention, custom, or emergence of new technology of those of ordinary skill in the art to which the present disclosure belongs. However, when a specific term is defined and used in an arbitrary meaning, the meaning of the term will be separately described. Therefore, the terms used in this specification should be interpreted based on the actual meaning of the terms and the contents of the entire specification, rather than names of simple terms.

The drawings attached to this specification are for easy explanation of the present disclosure, and the shapes shown in the drawings may be exaggerated as necessary to help understand the present disclosure, so the present disclosure is not limited by the drawings.

In the present specification, when it is determined that a detailed description of a known configuration or function related to the present disclosure may obscure the gist of the present disclosure, a detailed description thereof will be omitted if necessary.

The present disclosure relates to a display device and a manufacturing method thereof.

Hereinafter, a display device and a manufacturing method thereof according to one or more embodiments will be described with reference to accompanying drawings.

Figure 2:
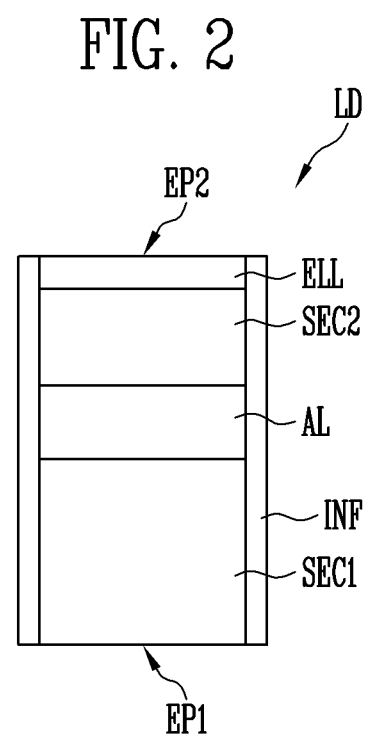

FIGS. 1 and 2 illustrate a light emitting element LD included in the display device according to one or more embodiments. FIGS. 1 and 2 are perspective and cross-sectional views illustrating a light emitting element according to one or more embodiments.

Referring to FIGS. 1 and 2, the light emitting element LD may include a first semiconductor layer SEC1, a second semiconductor layer SEC2, and an active layer AL interposed between the first semiconductor layer SEC1 and the second semiconductor layer SEC2. The light emitting element LD may further include an electrode layer ELL. According to one or more embodiments, the first semiconductor layer SEC1, the active layer AL, the second semiconductor layer SEC2, and the electrode layer ELL may be sequentially stacked in a direction of a length L of the light emitting element LD.

The light-emitting element LD may have a first end EP1 and a second end EP2. The first semiconductor layer SEC1 may be adjacent to the first end EP1 of the light emitting element LD. The second semiconductor layer SEC2 and the electrode layer ELL may be adjacent to the second end EP2 of the light emitting element LD.

According to one or more embodiments, the light emitting element LD may have a pillar shape. The pillar shape may mean a shape extending in the direction of the length L, such as a cylinder or polygonal pillar. That is, the length L of the light emitting element LD may be greater than a diameter D (or a width of a cross-section) thereof. The shape of the cross-section of the light emitting element LD may include a rod-like shape and a bar-like shape, but is not limited thereto.

The light emitting element LD may have a size of a nanometer scale to a micrometer scale. For example, each of the diameter D (or the width) and the length L of the light emitting element LD may have a size of a nanometer scale to a micrometer scale, but is not limited thereto.

The first semiconductor layer SEC1 may be a semiconductor layer of the first conductive type. For example, the first semiconductor layer SEC1 may include an N-type semiconductor layer. For example, the first semiconductor layer SEC1 may include any one semiconductor material of InAlGaN, GaN, AlGaN, InGaN, AlN, and InN, and may include an N-type semiconductor layer doped with a first conductive dopant such as Si, Ge, Sn, and the like. However, the material constituting the first semiconductor layer SEC1 is not limited thereto, and the first semiconductor layer SEC1 may be formed of various other materials.

The active layer AL may be disposed on the first semiconductor layer SEC1. The active layer AL may be disposed between the first semiconductor layer SEC1 and the second semiconductor layer SEC2.

The active layer AL may include any one of AlGaInP, AlGaP, AlInGaN, InGaN, and AlGaN. For example, when the active layer AL intends to output red light, the active layer AL may include AlGaInP and/or InGaN. When the active layer AL intends to output green light or blue light, the active layer AL may include InGaN. However, it is not limited to the above-described example.

The active layer AL may be formed in a single-quantum well or multi-quantum well structure.

The second semiconductor layer SEC2 may be disposed on the active layer AL, and may include a semiconductor layer of a different type from that of the first semiconductor layer SEC1. For example, the second semiconductor layer SEC2 may include a P-type semiconductor layer. For example, the second semiconductor layer SEC2 may include at least one semiconductor material of InAlGaN, GaN, AlGaN, InGaN, AlN, and InN, and may include a P-type semiconductor layer doped with a second conductive type dopant such as Mg and the like. However, the material constituting the second semiconductor layer SEC2 is not limited thereto, and various other materials may constitute the second semiconductor layer SEC2.

The electrode layer ELL may be formed on the second semiconductor layer SEC2. The electrode layer ELL may include a metal or a metal oxide. For example, the electrode layer ELL may include at least one of Cr, Ti, Al, Au, Ni, ITO, IZO, ITZO, and oxides or alloys thereof.

When a voltage equal to or greater than the threshold voltage is applied to both ends of the light emitting element LD, the light emitting element LD emits light while electron-hole pairs are combined in the active layer AL. By controlling the light that is emitted from the light emitting element LD using this principle, the light emitting element LD may be used as a light source of various light emitting elements including pixels of a display device (refer to 'DD' in FIG. 3).

The light-emitting element LD may further include an insulating film INF provided on a surface thereof. For example, the insulating film INF may be around or may surround an outer surface (e.g., an outer peripheral or circumferential surface) of the light emitting element LD. The insulating film INF may be a single layer or a plurality of layers.

The insulating film INF may expose both ends (e.g., EP1 and EP2) of the light emitting element LD having different polarities. For example, the insulating film INF may expose a portion of each of the first semiconductor layer SEC1 disposed adjacent to the first end EP1 and the electrode layer ELL disposed adjacent to the second end EP2.

The insulating film INF may include any one of silicon oxide (SiOx), silicon nitride (SiNx), silicon oxynitride (SiOxNy), aluminum oxide (AlOx), and titanium oxide (TiOx). However, it is not limited to a specific example.

The insulating film INF may secure electrical stability of the light emitting element LD. In addition, even when a plurality of light emitting elements LD are disposed close to each other, it is possible to prevent an unwanted short circuit between the light emitting elements LD.

According to one or more embodiments, the light emitting element LD may further include additional components other than the first semiconductor layer SEC1, the active layer AL, the second semiconductor layer SEC2, the electrode layer ELL, and the insulating film INF. For example, the light emitting element LD may further include a phosphor layer, an additional active layer, an additional semiconductor layer, and/or an electrode layer.

Figure 3:
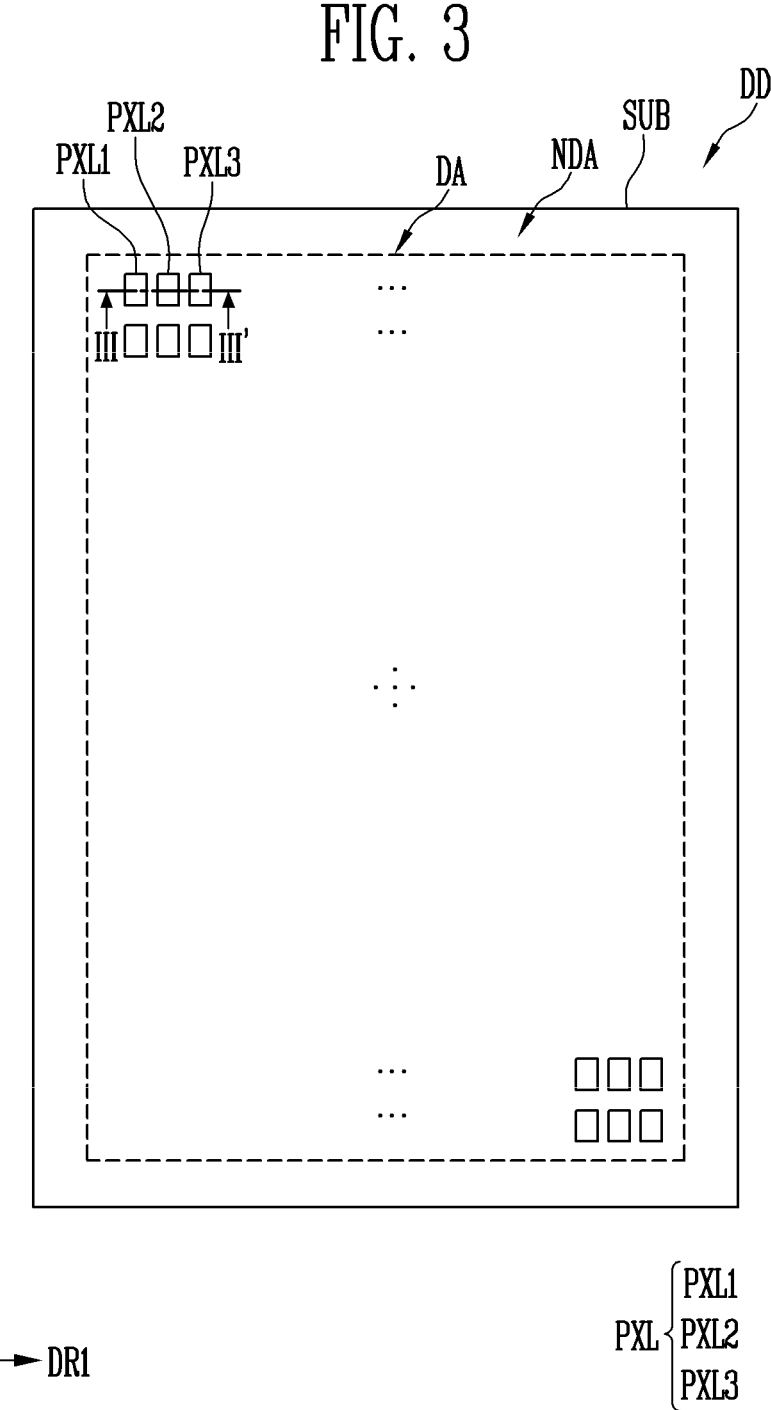
FIG. 3 is a plan view schematically illustrating a display device according to one or more embodiments.

FIG. 3 is a plan view schematically illustrating a display device according to one or more embodiments.

The display device DD is configured to emit light. Referring to FIG. 3, the display device DD may include a substrate SUB and a pixel PXL disposed on the substrate SUB. Although not shown in the drawing, the display device DD may further include a driving circuit unit (e.g., a scan driver and a data driver) for driving the pixel PXL, wires, and pads.

The display device DD may include a display area DA and a non-display area NDA around the edge or periphery of the display area DA. The non-display area NDA may mean an area other than the display area DA. The non-display area NDA may surround at least a portion of the display area DA.

The substrate SUB may constitute a base member of the display device DD. The substrate SUB may be a rigid or flexible substrate or film, but is not limited to a specific example.

The display area DA may mean an area in which the pixels PXL are disposed. The non-display area NDA may mean an area in which the pixel PXL is not disposed. A driving circuit unit, wires, and pads connected to the pixel PXL of the display area DA may be disposed in the non-display area NDA.

According to one or more embodiments, the pixels PX may be arranged in a stripe or a PENTILE® arrangement structure, but the present disclosure is not limited thereto. This PENTILE arrangement structure may be referred to as an RGBG matrix structure (e.g., a PENTILE® matrix structure or an RGBG structure (e.g., a PENTILER structure)). PENTILER is a registered trademark of Samsung Display Co., Ltd., Republic of Korea. However, the present disclosure is not limited thereto, and various known embodiments may be applied.

According to one or more embodiments, the pixel PXL may include a first pixel PXL1, a second pixel PXL2, and a third pixel PXL3. Each of the first pixel PXL1, the second pixel PXL2, and the third pixel PXL3 may be a sub-pixel. At least one of the first pixel PXL1, the second pixel PXL2, and the third pixel PXL3 may constitute one pixel unit capable of emitting light of various colors.

For example, each of the first pixel PXL1, the second pixel PXL2, and the third pixel PXL3 may emit light of a desired color (e.g., a set or predetermined color). For example, the first pixel PXL1 may be a red pixel emitting light of red (e.g., a first color), the second pixel PXL2 may be a green pixel emitting light of green (e.g., a second color), and the third pixel PXL3 may be a blue pixel emitting light of blue (e.g., a third color). However, the color, type, and/or number of the first pixel PXL1, the second pixel PXL2, and the third pixel PXL3 constituting each of the pixel units are not limited to specific examples.

Hereinafter, the structure of the pixel PXL according to the described embodiment will be described in more detail with reference to FIGS. 4 to 13.

FIGS. 4 to 8 are plan views illustrating pixels according to one or more embodiments.

Figure 4:
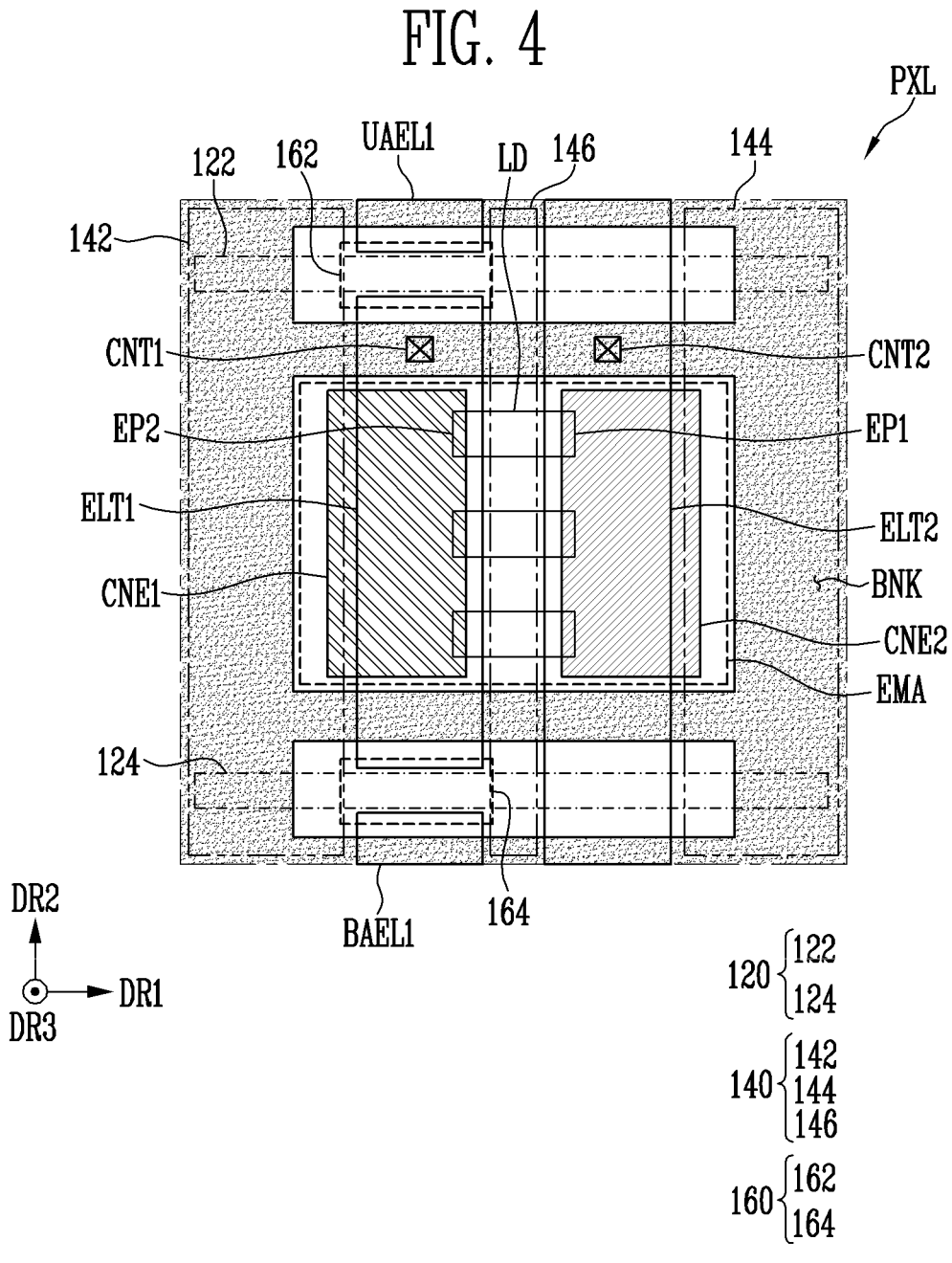
FIGS. 4 to 8 are plan views illustrating pixels according to one or more embodiments.

The pixel PXL illustrated in FIG. 4 may be any one of the first to third pixels PXL1, PXL2, and PXL3.

Figure 5:
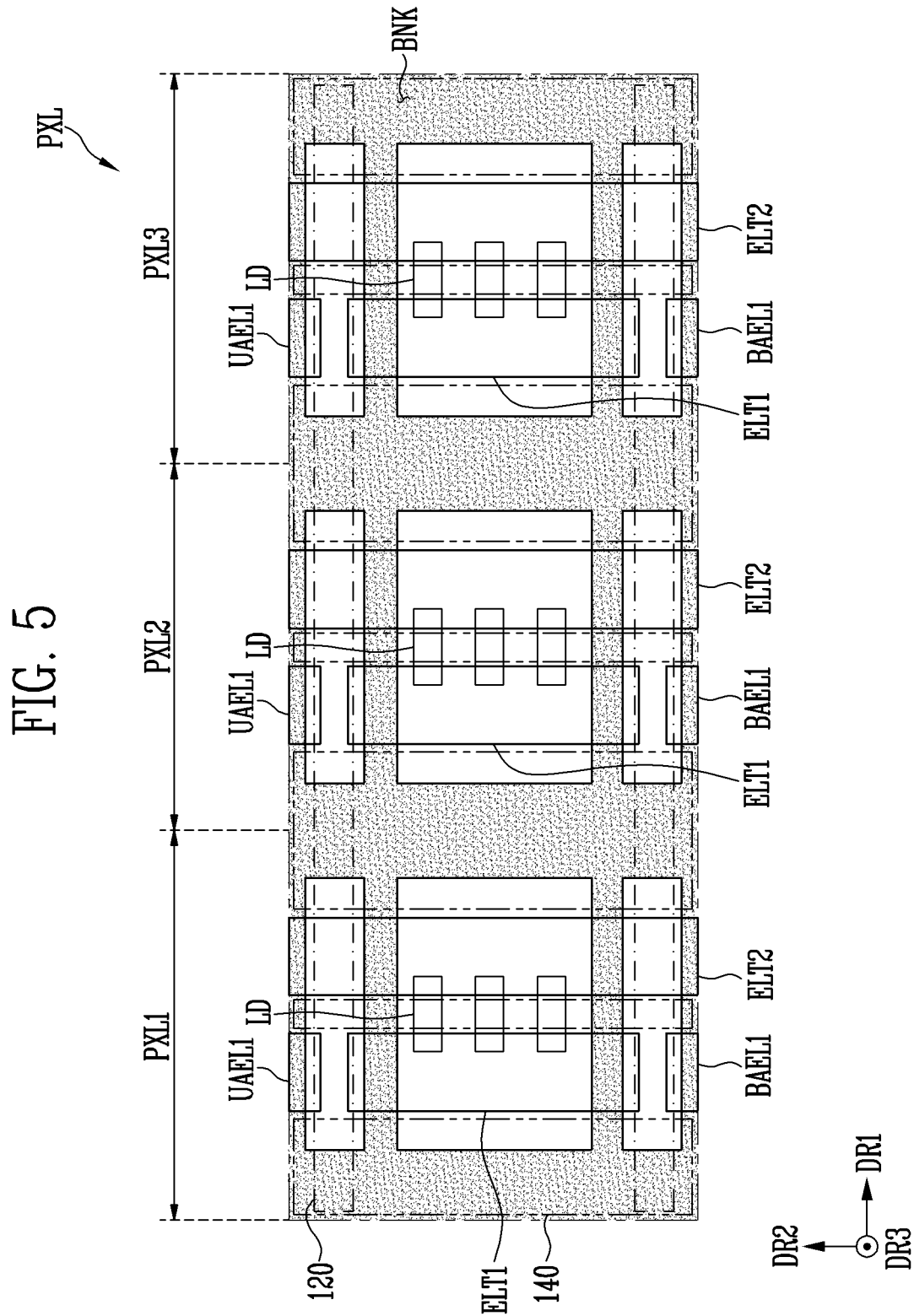

The pixel PXL illustrated in FIG. 5 may be a plan view illustrating a plurality of sub-pixels, and may schematically illustrate the first to third pixels PXL1, PXL2, and PXL3.

Figure 6:
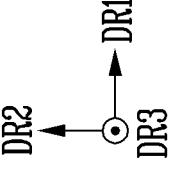

FIG. 6 may be a drawing illustrating a lattice structure included in the pixel PXL according to one or more embodiments, and may be a schematic drawing for illustrating a lattice structure formed by the first extension area 120 and the second extension area 140.

Figure 7:
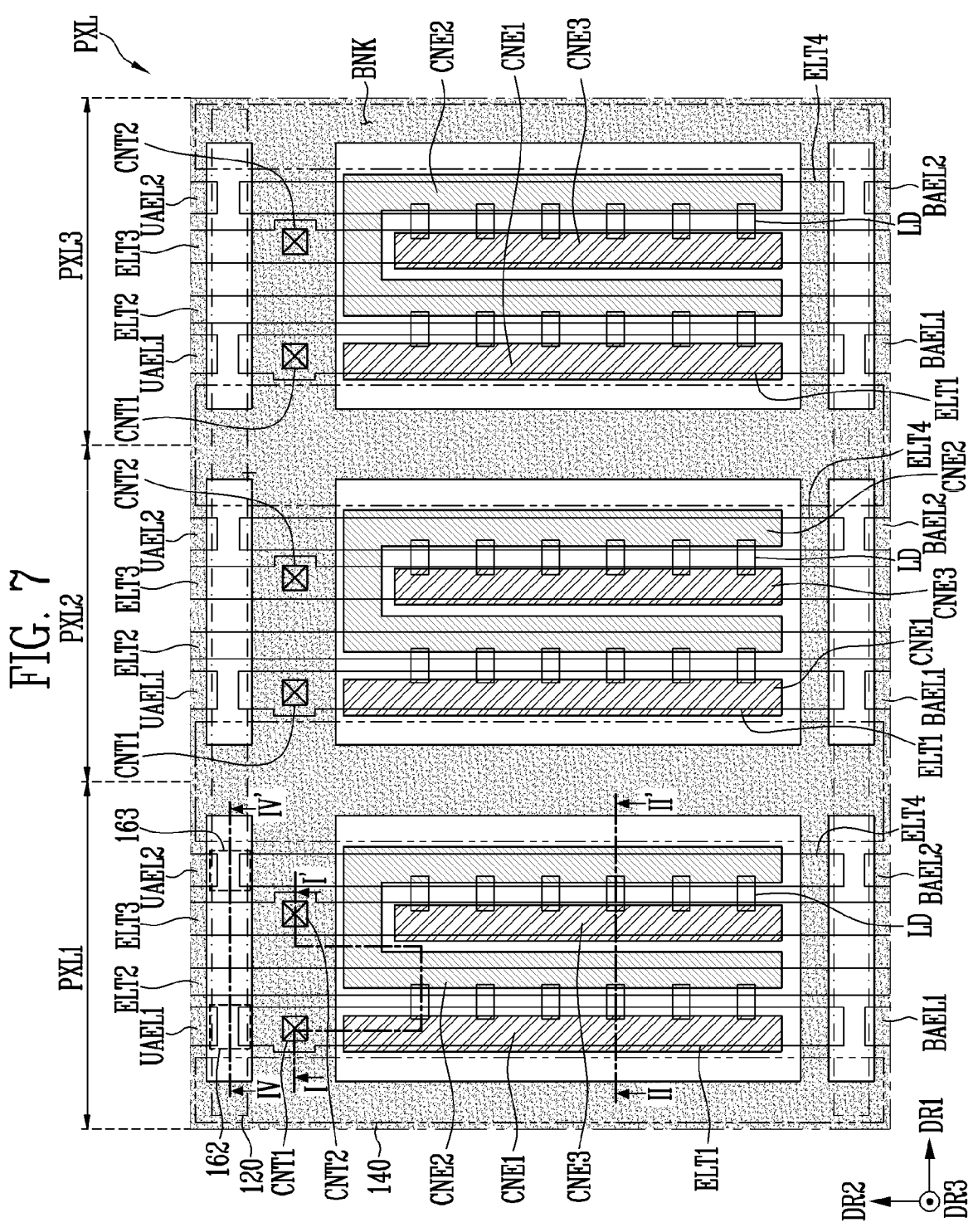

The pixel PXL illustrated in FIG. 7 may be a plan view illustrating a plurality of sub-pixels, and may illustrate an structure of the first to third pixels PXL1, PXL2, and PXL3. FIG. 7 may be a plan view illustrating a structure of a pixel PXL in which two types of alignment areas are formed.

Figure 8:
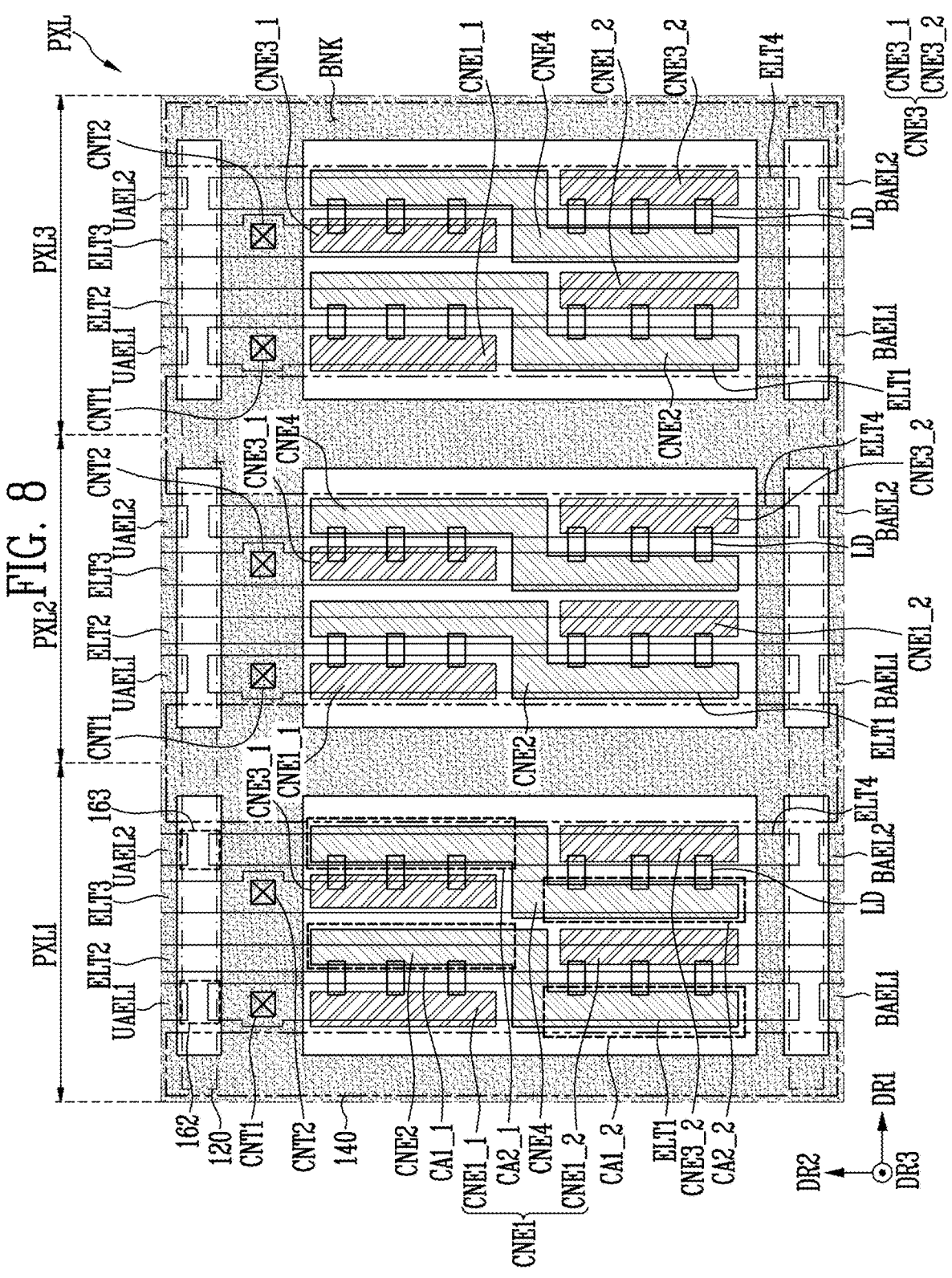

The pixel PXL illustrated in FIG. 8 may be a plan view illustrating a plurality of sub-pixels, and may represent a structure of the first to third pixels PXL1, PXL2, and PXL3. FIG. 8 may be a plan view illustrating a structure of a pixel PXL in which four types of alignment areas are formed.

Referring first to FIG. 4, the pixel PXL may include a light emitting element LD, a first electrode ELT1, a second electrode ELT2, a first upper adjacent electrode UAEL1, a first lower adjacent electrode BAEL1, a first contact part CNT1, a second contact part CNT2, a first contact electrode CNE1, a second contact electrode CNE2, and a bank BNK.

According to one or more embodiments, the pixel PXL may include a first extension area 120 and a second extension area 140. According to one or more embodiments, the first extension area 120 may include a 1-1-th extension area 122 and a 1-2-th extension area 124. The second extension area 140 may include a 2-1-th extension area 142, a 2-2-th extension area 144, and a 2-3-th extension area 146.

For convenience of description, in the accompanying drawings, the first extension area 120 may be indicated by a dash-single dotted line, and the second extension area 140 may be indicated by a dash-double dotted line.

A plurality of light emitting elements LD may be provided and arranged in the pixel PXL. For example, the light emitting elements LD may be arranged in a parallel structure along the second direction DR2. However, the arrangement structure of the light emitting element LD is not limited thereto.

The light emitting element LD may be disposed between electrodes configured to function as alignment electrodes.

For example, the light emitting element LD may be disposed between the first electrode ELT1 and the second electrode ELT2. The light emitting element LD may be disposed on the first electrode ELT1 and the second electrode ELT2. At least a portion of the light emitting element LD may be disposed between the first electrode ELT1 and the second electrode ELT2 when viewed in a plan view.

The light emitting element LD may be electrically connected to the first electrode ELT1 through the first contact electrode CNE1.

According to one or more embodiments, the second end EP2 of the light emitting element LD may be electrically connected to the first contact electrode CNE1. Accordingly, the second semiconductor layer SEC2 of the light emitting element LD may be electrically connected to the first electrode ELT1 and the first contact electrode CNE1.

The light emitting element LD may be electrically connected to the second electrode ELT2 through the second contact electrode CNE2.

According to one or more embodiments, the first end EP1 of the light emitting element LD may be electrically connected to the second contact electrode CNE2. Accordingly, the first semiconductor layer SEC1 of the light emitting element LD may be electrically connected to the second electrode ELT2 and the second contact electrode CNE2.

The first electrode ELT1 may extend in the second direction DR2. The first electrode ELT1 may be spaced from the second electrode ELT2 in the first direction DR1. Here, the second direction DR2 may cross (or not be parallel to) the first direction DR1.

The first electrode ELT1 may be electrically connected to the transistor TR included in the pixel circuit unit (refer to 'PCL' of FIG. 9) through the first contact part CNT1.

The first electrode ELT1 may be electrically connected to the first contact electrode CNE1. The first electrode ELT1 may be electrically connected to the light emitting element LD through the first contact electrode CNE1.

The first electrode ELT1 may not be disposed in the first extension area 120. For example, the 1-1-th extension area 122 may be disposed on one side of the first electrode ELT1 and the 1-2-th extension area 124 disposed on the other side of the first electrode ELT1.

The first electrode ELT1 may not be disposed in the second extension area 140. For example, the first electrode ELT1 may be disposed between a 2-1-th extension area 142 disposed on one side of the first electrode ELT1 and a 2-3-th extension area 146 disposed on the other side of the first electrode ELT1.

The second electrode ELT2 may extend in the second direction DR2. The second electrode ELT2 may be spaced from the first electrode ELT1 in the first direction DR1.

The second electrode ELT2 may be electrically connected to a power line (refer to 'PL' of FIG. 9) included in the pixel circuit unit PCL through the second contact part CNT2. According to one or more embodiments, the second electrode ELT2 may not be directly connected to the second contact part CNT2 (refer to FIG. 7).

The second electrode ELT2 may be electrically connected to the second contact electrode CNE2. The second electrode ELT2 may be electrically connected to the light emitting element LD through the second contact electrode CNE2.

A portion of the second electrode ELT2 may be disposed in the first extension area 120. For example, a portion of the second electrode ELT2 may overlap the first extension area 120 when viewed in a plan view. A portion of the second electrode ELT2 may overlap the 1-1-th extension area 122 when viewed in a plan view, and another portion of the second electrode ELT2 may overlap the 1-2-th extension area 124 when viewed in a plan view.

The second electrode ELT2 may not be disposed in the second extension area 140. For example, the second electrode ELT2 may be disposed between a 2-3-th extension area 146 disposed on one side of the second electrode ELT2 and a 2-2-th extension area 144 disposed on the other side of the second electrode ELT2.

The first upper adjacent electrode UAEL1 may extend in the second direction DR2. The first upper adjacent electrode UAEL1 may be disposed adjacent to the first electrode ELT1 and the second electrode ELT2.

For example, the first upper adjacent electrode UAEL1 may be spaced from the first electrode ELT1 in the second direction DR2. The first upper adjacent electrode UAEL1 may be spaced from the second electrode ELT2 in the first direction DR1.

The first upper adjacent electrode UAEL1 may be an alignment electrode for the light emitting element LD disposed in a sub-pixel adjacent to a sub-pixel related to the light emitting element LD disposed between the first electrode ELT1 and the second electrode ELT2 in the second direction DR2.

For example, the first upper adjacent electrode UAEL1 and a portion of the second electrode ELT2 may function as an alignment electrode for the pixel PXL adjacent to an upper side of the pixel PXL illustrated in FIG. 4.

The first upper adjacent electrode UAEL1 may not be disposed in the first extension area 120 and the second extension area 140.

The first lower adjacent electrode BAEL1 may extend in the second direction DR2. The first lower adjacent electrode BAEL1 may be disposed adjacent to the first electrode ELT1 and the second electrode ELT2.

For example, the first lower adjacent electrode BAEL1 may be spaced from the first electrode ELT1 in the second direction DR2. The first lower adjacent electrode BAEL1 may be spaced from the second electrode ELT2 in the first direction DR1.

The first lower adjacent electrode BAEL1 may be an alignment electrode for the light emitting element LD disposed in a sub-pixel adjacent to a sub-pixel related to the light emitting element LD disposed between the first electrode ELT1 and the second electrode ELT2 in the second direction DR2.

For example, the first lower adjacent electrode BAEL1 and a portion of the second electrode ELT2 may function as an alignment electrode for the pixel PXL adjacent to a lower side of the pixel PXL illustrated in FIG. 4.

The first lower adjacent electrode BAEL1 may not be disposed in the first extension area 120 and the second extension area 140.

The first contact electrode CNE1 may be disposed on first electrode ELT1 to be electrically connected to the first electrode ELT1. The first contact electrode CNE1 may electrically connect the first electrode ELT1 and the light emitting element LD.

The second contact electrode CNE2 may be disposed on the second electrode ELT2 to be electrically connected to the second electrode ELT2. The second contact electrode CNE2 may electrically connect the second electrode ELT2 and the light emitting element LD.

The first extension area 120 may extend in the first direction DR1. A plurality of first extension areas 120 may be provided and arranged at a suitable distance (e.g., a set or predetermined distance) in the display area DA.

The first extension area 120 may include a separation area 160. The first electrode ELT1, the first upper adjacent electrode UAEL1, and the first lower adjacent electrode BAEL1 may not be disposed in the first extension area 120. A portion of the second electrode ELT2 may be disposed in the first extension area 120. According to one or more embodiments, the separation area 160 may include a first separation area 162 and a lower separation area 164.

For example, the 1-1-th extension area 122 may include a first separation area 162 disposed between the first electrode ELT1 and the first upper adjacent electrode UAEL1. The 1-2-th extension area 124 may include a lower separation area 164 disposed between the first electrode ELT1 and the first lower adjacent electrode BAEL1.

The second extension area 140 may extend in the second direction DR2. A plurality of second extension areas 140 may be provided and arranged at a suitable distance (e.g., a set or predetermined distance) in the display area DA.

The first electrode ELT1 and the second electrode ELT2 may not be disposed in the second extension area 140.

For example, the 2-1 th extension area 142, the 2-2-th extension area 144, and the 2-3-th extension area 146 may not overlap the first electrode ELT1 and the second electrode ELT2 when viewed in a plan view.

The separation area 160 may mean an area in which the first electrode ELT1 and the adjacent alignment electrode are spaced from each other. For example, the separation area 160 may include a first separation area 162 that is an area between the first electrode ELT1 and the first upper adjacent electrode UAEL1 and a lower separation area 164 that is an area between the first electrode ELT1 and the first lower adjacent electrode BAEL1.

According to one or more embodiments, the first electrode ELT1, the second electrode ELT2, the first upper adjacent electrode UAEL1, and the first lower adjacent electrode BAEL1 may be formed in the same process and may include the same material. For example, the first electrode ELT1, the second electrode ELT2, the first upper adjacent electrode UAEL1, and the first lower adjacent electrode BAEL1 may be provided by being patterned (or etched) in the same process.

The bank BNK may protrude in the display direction (e.g., the third direction DR3) (or the thickness direction of the substrate SUB) of the display device DD. The bank BNK may include an organic material or an inorganic material, but is not limited to a specific example.

According to one or more embodiments, the bank BNK may define the light emitting area EMA of the pixel PXL. According to one or more embodiments, the bank BNK may be provided to be around (or to surround) the light emitting area EMA. The light emitting area EMA may be an area from which light is emitted, and the light emitting element LD may be disposed in the light emitting area EMA.

Next, a plurality of sub-pixels will be mainly described with reference to FIG. 5.

Referring to FIG. 5, the pixel PXL may include first to third pixels PXL1, PXL2, and PXL3 constituting sub-pixels. According to one or more embodiments, a structure in which the first to third pixels PXL1, PXL2, and PXL3 are arranged along the first direction DR1 will be described. However, the structure is not necessarily limited to this embodiment.

According to one or more embodiments, the first extension area 120 may extend in the first direction DR1 and may be disposed over the first to third pixels PXL1, PXL2, and PXL3. For example, the first extension area 120 may overlap the first to third pixels PXL1, PXL2, and PXL3 when viewed in a plan view.

According to one or more embodiments, the second extension area 140 may extend in the second direction DR2 and may be disposed in each of the first to third pixels PXL1, PXL2, and PXL3. For example, the second extension area 140 may overlap the first to third pixels PXL1, PXL2, and PXL3 when viewed in a plan view.

Accordingly, the first extension area 120 and the second extension area 140 may form a lattice structure. This will be described with reference to FIG. 6.

Referring to FIG. 6, a plurality of the first extension area 120 and a plurality of the second extension area 140 may be provided and extend in a suitable direction (e.g., a set or predetermined direction). Accordingly, the first extension area 120 and the second extension area 140 may form a plurality of overlapping areas 300.

The overlapping area 300 may be an area in which the first extension area 120 and the second extension area 140 overlap each other when viewed in a plan view, and a plurality of overlapping areas may be provided.

Accordingly, the first extension area 120 and the second extension area 140 may provide a lattice structure in which the overlapping area 300 is a lattice point.

According to the described embodiment, a suitable etching process (e.g., a set or predetermined etching process) may be performed to form the first extension area 120 and the second extension area 140, short defects between alignment electrodes may be prevented, and process costs may be reduced. A detailed description thereof will be described later with reference to FIGS. 16 and 17.

Next, a structure of the first to third pixels PXL1, PXL2, and PXL3 according to one or more embodiments will be described with reference to FIG. 7.

According to the present embodiment, a plurality of way areas may be provided in each of the first to third pixels PXL1, PXL2, and PXL3. For example, two types of alignment areas may be provided in each of the first to third pixels PXL1, PXL2, and PXL3.

This embodiment will be mainly described with reference to the first pixel PXL1. The technical features of the first pixel PXL1 may be applied to the second pixel PXL2 and the third pixel PXL3, and overlapping details will be omitted for convenience of description.

As described above with reference to FIGS. 4 to 6, according to the present embodiment, the first extension area 120 and the second extension area 140 may be formed in the lattice shape and provided in a suitable pattern (e.g., a set or predetermined pattern).

Hereinafter, content different from the above will be mainly described, and content overlapping with the above will be omitted.

According to one or more embodiments, the first pixel PXL1 may further include a third electrode ELT3, a fourth electrode ELT4, a second upper adjacent electrode UAEL2, and a second lower adjacent electrode BAEL2.

The light emitting element LD may be disposed between the third electrode ELT3 and the fourth electrode ELT4. The light emitting element LD may be disposed on the third electrode ELT3 and the fourth electrode ELT4.

The third electrode ELT3 may extend in the second direction DR2. The third electrode ELT3 may be disposed between the second electrode ELT2 and the fourth electrode ELT4. The third electrode ELT3 may be spaced from the second electrode ELT2 and the fourth electrode ELT4 in the first direction DR1.

The third electrode ELT3 may be electrically connected to the power line PL of the pixel circuit unit PCL through the second contact part CNT2. The third electrode ELT3 may receive a cathode signal from the power line PL.

The third electrode ELT3 may be electrically connected to the third contact electrode CNE3. The third electrode ELT3 may be electrically connected to the light emitting element LD through the third contact electrode CNE3.

The third electrode ELT3 may overlap the first extension area 120 when viewed in a plan view. The third electrode ELT3 may not be disposed in the second extension area 140.

The fourth electrode ELT4 may extend in the second direction DR2. The fourth electrode ELT4 may be spaced from the third electrode ELT3 in the first direction DR1.

The fourth electrode ELT4 may be electrically connected to the second contact electrode CNE2. The fourth electrode ELT4 may be electrically connected to the light emitting element through the second contact electrode CNE2.

The fourth electrode ELT4 may not be disposed in the first extension area 120. The fourth electrode ELT4 may not be disposed in the second extension area 140.

According to one or more embodiments, a portion of the second contact electrode CNE2 may electrically connect the second electrode ELT2 and the first light emitting element, and another portion of the second contact electrode CNE2 may electrically connect the fourth electrode ELT4 and the second light emitting element. Here, the first light emitting element may be a light emitting element LD disposed on the first electrode ELT1 and the second electrode ELT2, and the second light emitting element may be a light emitting element LD disposed on the third electrode ELT3 and the fourth electrode ELT4.

The second upper adjacent electrode UAEL2 may extend in the second direction DR2. The second upper adjacent electrode UAEL2 may be disposed adjacent to the third electrode ELT3 and the fourth electrode ELT4.

For example, the second upper adjacent electrode UAEL2 may be spaced from the fourth electrode ELT4 in the second direction DR2. The second upper adjacent electrode UAEL2 may be spaced from the third electrode ELT3 in the first direction DR1.

The second upper adjacent electrode UAEL2 may be spaced from the fourth electrode ELT4 with the second separation area 163 interposed therebetween. According to one or more embodiments, the second separation area 163 may be included in the first extension area 120.

The second upper adjacent electrode UAEL2 may be an alignment electrode for the light emitting element LD disposed in a sub-pixel adjacent to a sub-pixel related to the light emitting element LD disposed between the third electrode ELT3 and the fourth electrode ELT4 in the second direction DR2.

For example, the second upper adjacent electrode UAEL2 and a portion of the third electrode ELT3 may function as an alignment electrode for the pixel PXL adjacent to an upper side of the pixel PXL illustrated in FIG. 7.

The second upper adjacent electrode UAEL2 may not be disposed in the first extension area 120 and the second extension area 140.

The second lower adjacent electrode BAEL2 may extend in the second direction DR2. The second lower adjacent electrode BAEL2 may be disposed adjacent to the third electrode ELT3 and the fourth electrode ELT4.

For example, the second lower adjacent electrode BAEL2 may be spaced from the fourth electrode ELT4 in the second direction DR2. The second lower adjacent electrode BAEL2 may be spaced from the third electrode ELT3 in the first direction DR1.

The second lower adjacent electrode BAEL2 may be an alignment electrode for the light emitting element LD disposed in a sub-pixel adjacent to a sub-pixel related to the light emitting element LD disposed between the third electrode ELT3 and the fourth electrode ELT4 in the second direction DR2.

For example, the second lower adjacent electrode BAEL2 and a portion of the third electrode ELT3 may function as an alignment electrode for the pixel PXL adjacent to a lower side of the pixel PXL illustrated in FIG. 7.

The second lower adjacent electrode BAEL2 may not be disposed in the first extension area 120 and the second extension area 140.

Accordingly, according to the structure of the pixel PXL illustrated in FIG. 7, the first alignment area in which the light emitting elements LD are arranged may be provided between the first contact electrode CNE1 and one area of the second contact electrode CNE2, and the second alignment area in which the light emitting elements LD are arranged may be provided between the third contact electrode CNE3 and the other area of the second contact electrode CNE2. That is, in the present embodiment, two types of alignment areas may be provided.

Next, a structure of the first to third pixels PXL1, PXL2, and PXL3 according to another embodiment will be described with reference to FIG. 8. Contents that may overlap with the above are omitted or be briefly described. As described above, the first pixel PXL1 will be mainly described, and technical features of the first pixel PXL1 may be similarly applied to the second pixel PXL2 and the third pixel PXL3.

According to this embodiment, four types of alignment areas may be provided. For example, a plurality of alignment areas having different directions of polarities of the light emitting element LD may be provided between the first electrode ELT1 and the second electrode ELT2, and a plurality of alignment areas having different directions of polarities of the light emitting element LD may be provided between the third electrode ELT3 and the fourth electrode ELT4.

The first contact electrode CNE1 may include a 1_1-th contact electrode CNE1_1 for forming the first alignment area and a 1_2-th contact electrode CNE1_2 for forming the second alignment area. The second contact electrode CNE2 may include a 1_1-th contact area CA1_1 for forming the first alignment area and a 1_2-th contact area CA1_2 for forming the second alignment area.

The 1_1-th contact electrode CNE1_1 and the second contact electrode CNE2 in the 1_1-th contact area CA1_1 may form the first alignment area. For example, the 1_1-th contact electrode CNE1_1 may be disposed on one side of the first electrode ELT1 and may be electrically connected to one end of the light emitting element LD. In addition, the second contact electrode CNE2 in the 1_1-th contact area CA1_1 may be disposed on the second electrode ELT2 adjacent to one side of the 1_1-th contact electrode CNE1_1, and may be electrically connected to the other end of the light emitting element LD.

The 1_2-th contact electrode CNE1_2 and the second contact electrode CNE2 in the 1_2-th contact area CA1_2 may form the second alignment area. For example, the 1_2-th contact electrode CNE1_2 may be disposed on one side of the second electrode ELT2 and may be electrically connected to one end of the light emitting element LD. In addition, the second contact electrode CNE2 in the 1_2-th contact area CA1_2 may be disposed on the first electrode ELT1 adjacent to one side of the 1_2-th contact electrode CNE1_2, and may be electrically connected to the other end of the light emitting element LD.

The third contact electrode CNE3 may include a 3_1-th contact electrode CNE3_1 for forming a third alignment area and a 3_2-th contact electrode CNE3_2 for forming a fourth alignment area. The first pixel PXL1 may further include a fourth contact electrode CNE4. The fourth contact electrode CNE4 may include a 2_1-th contact area CA2_1 for forming the third alignment area and a 2_2-th contact area CA2_2 for forming the fourth alignment area.

The 3_1-th contact electrode CNE3_1 and the fourth contact electrode CNE4 in the 2_1-th contact area CA2_1 may form the third alignment area. For example, the 3_1-th contact electrode CNE3_1 may be disposed on one side of the third electrode ELT3 and may be electrically connected to one end of the light emitting element LD. In addition, the fourth contact electrode CNE4 in the 2_1-th contact area CA2_1 may be disposed on the fourth electrode ELT4 adjacent to one side of the 3_1-th contact electrode CNE3_1, and may be electrically connected to the other end of the light emitting element LD.

The 3_2-th contact electrode CNE3_2 and the fourth contact electrode CNE4 in the 2_2-th contact area CA2_2 may form the fourth alignment area. For example, the 3_2-th contact electrode CNE3_2 may be disposed on one side of the fourth electrode ELT4 and may be electrically connected to one end of the light emitting element LD. In addition, the fourth contact electrode CNE4 in the 2_2-th contact area CA2_2 may be disposed on the third electrode ELT3 adjacent to one side of the 3_2-th contact electrode CNE3_2, and may be electrically connected to the other end of the light emitting element LD.

According to the present embodiment, four types of alignment areas are provided, so that the light emitted from the pixel PXL can be more precisely controlled.

In one or more embodiments, the second extension area 140 may be provided between the first electrode ELT1 and the second electrode ELT2 and between the third electrode ELT3 and the fourth electrode ELT4. That is, by the second extension area 140, the first electrode ELT1 and the second electrode ELT2 may be spaced from each other in the first direction DR1, and the third electrode ELT3 and the fourth electrode ELT4 may be spaced from each other in the first direction DR1. According to one or more embodiments, the second extension area 140 formed by etching the base electrode BELT to provide the first to fourth electrodes ELT1 to ELT4 may overlap the above-described alignment areas.

For example, the second extension area 140 may overlap the first alignment area, the second alignment area, the third alignment area, and the fourth alignment area when viewed in a plan view. According to one or more embodiments, a portion of the second extension area 140 provided between the first electrode ELT1 and the second electrode ELT2 may overlap the first alignment area and the second alignment area when viewed in a plan view. Similarly, a portion of the second extension area 140 provided between the third electrode ELT3 and the fourth electrode ELT4 may overlap the third alignment area and the fourth alignment area when viewed in a plan view.

According to one or more embodiments, when forming four types of alignment areas, it is necessary to control a distance between the first to fourth electrodes ELT1 to ELT4 while preventing a short circuit therebetween so that operations of the light emitting elements LD are finely controlled. Accordingly, according to one or more embodiments, the etching process for forming the first to fourth electrodes ELT1 to ELT4 may be performed in one batch, so that the etching process can be simplified and the alignment area can be provided in detail.

Hereinafter, a cross-sectional structure of the pixel PXL according to the described embodiment will be mainly described with reference to FIGS. 9 to 12. Contents that may overlap with the above will be briefly described or omitted.

Figure 9:
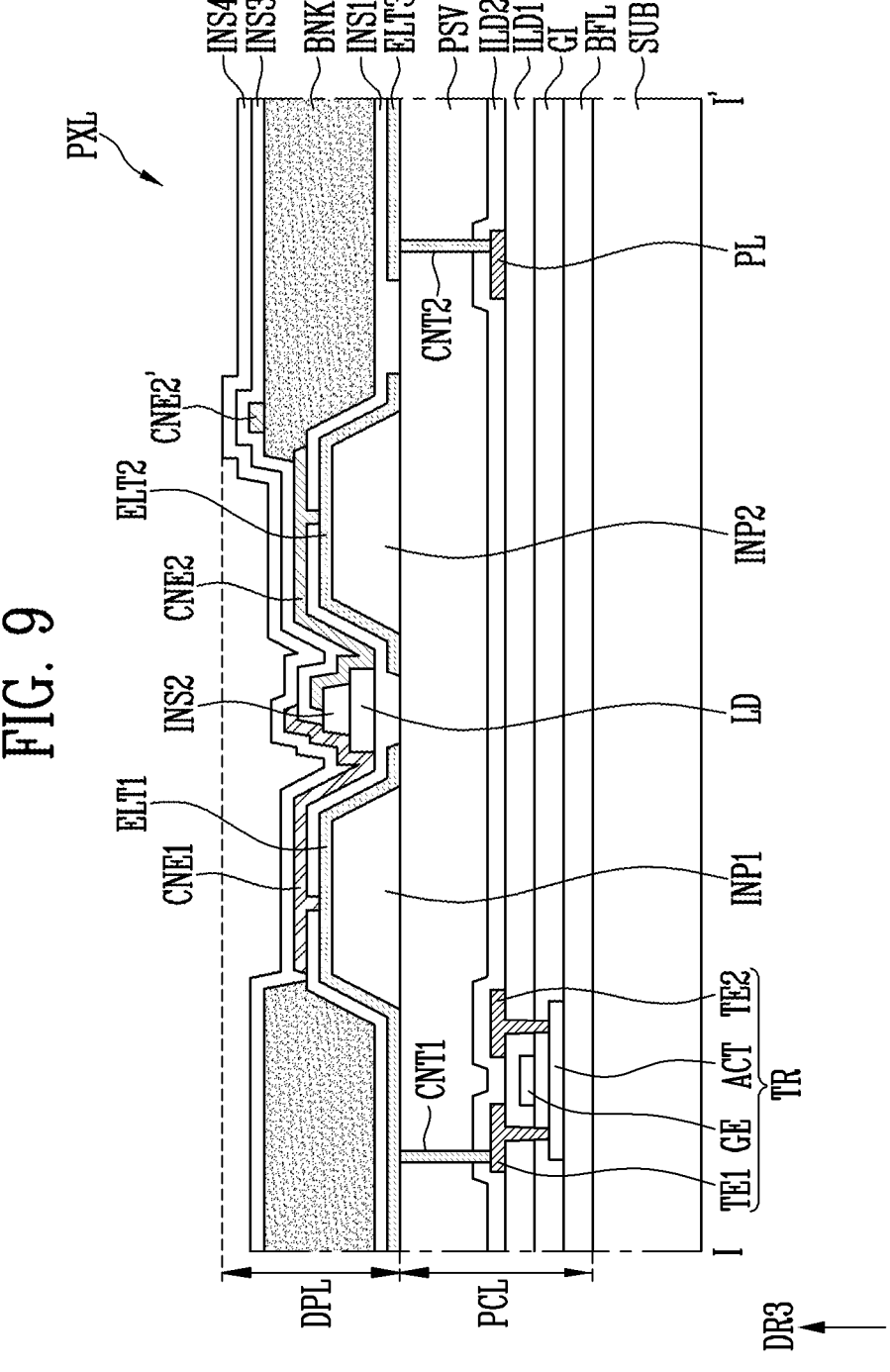
FIG. 9 is a cross-sectional view taken along the line I-I' of FIG. 7.
Figure 10:
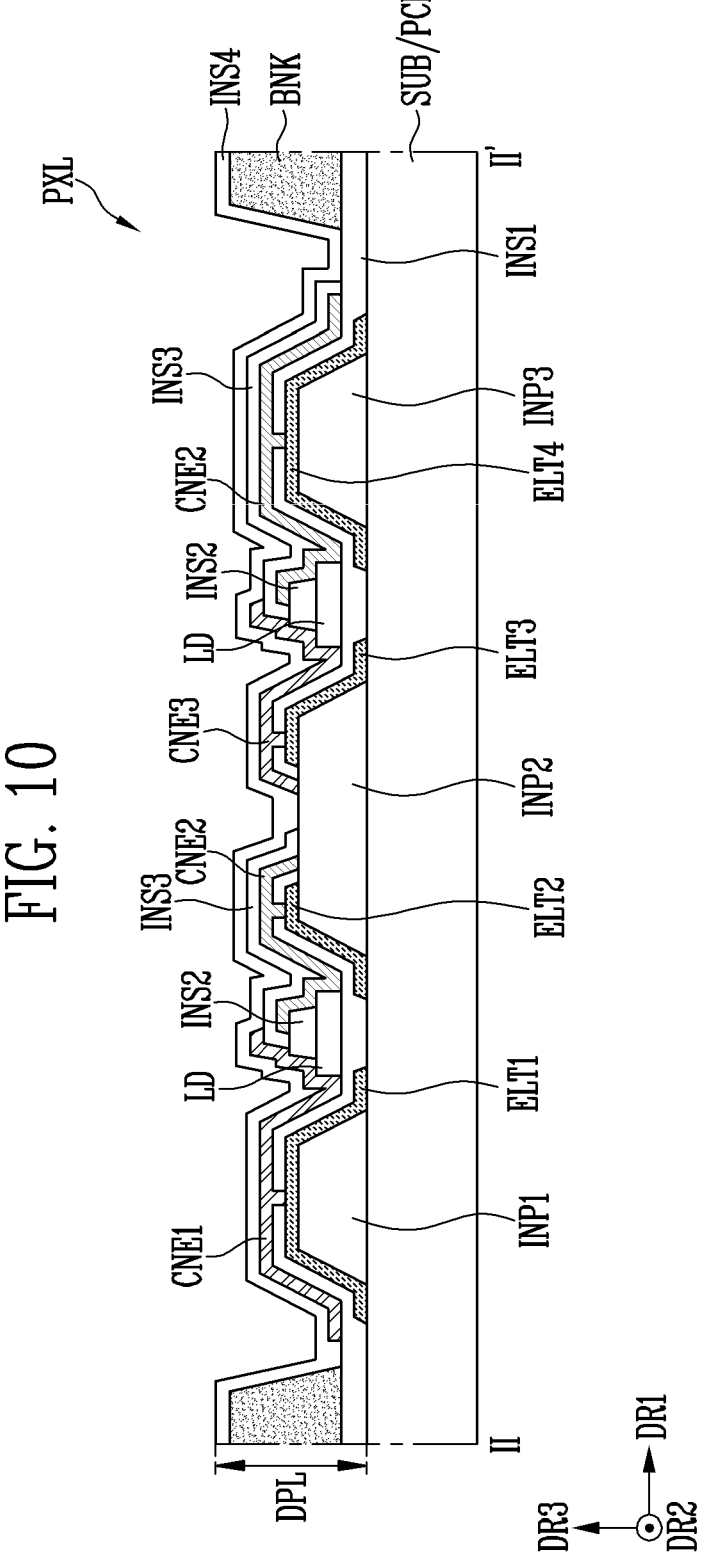
FIG. 10 is a cross-sectional view taken along the line II-II' of FIG. 7.
Figure 11:
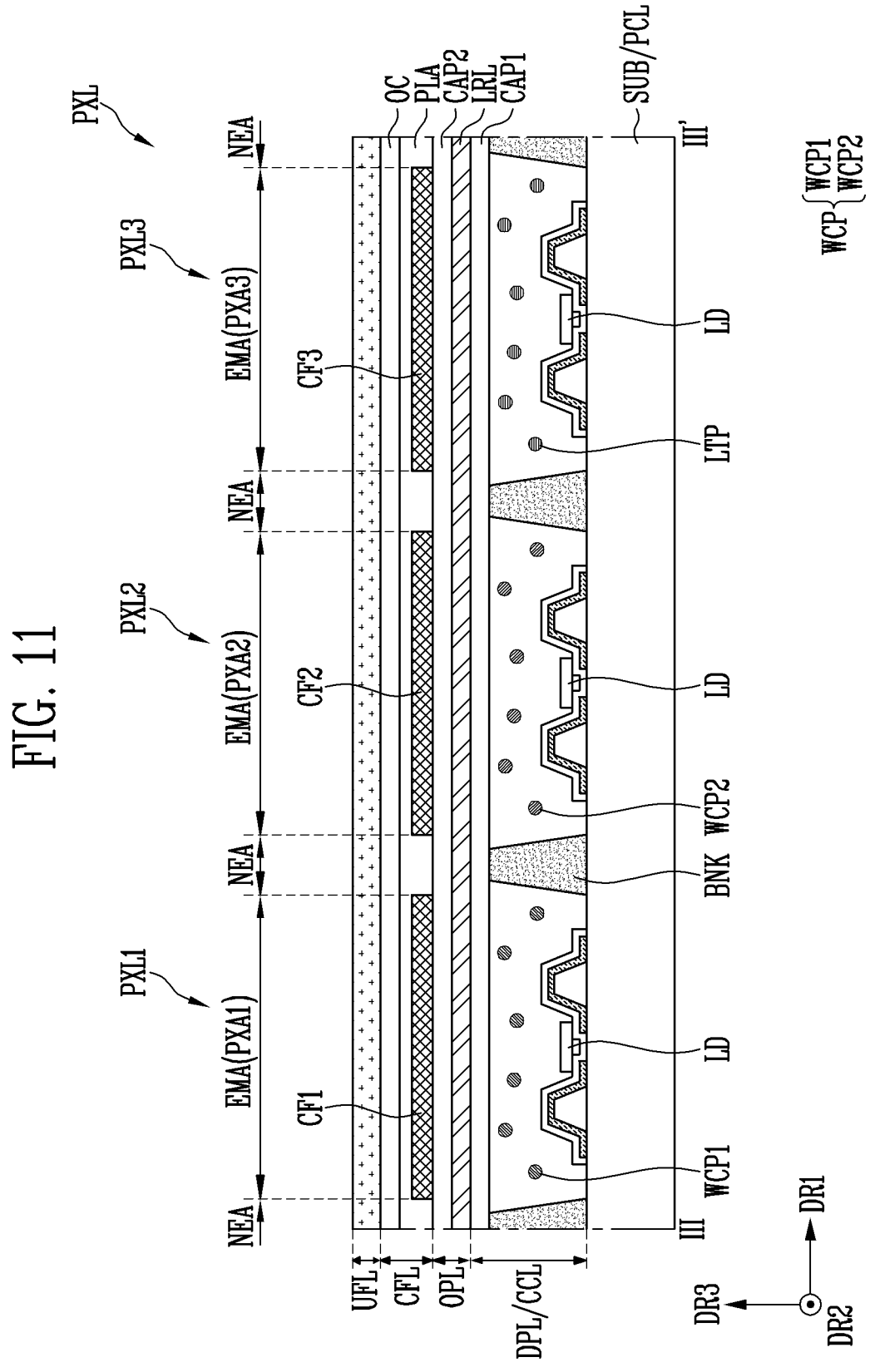
FIGS. 11 and 12 are cross-sectional views taken along the line III-III' of FIG. 3.
Figure 12:
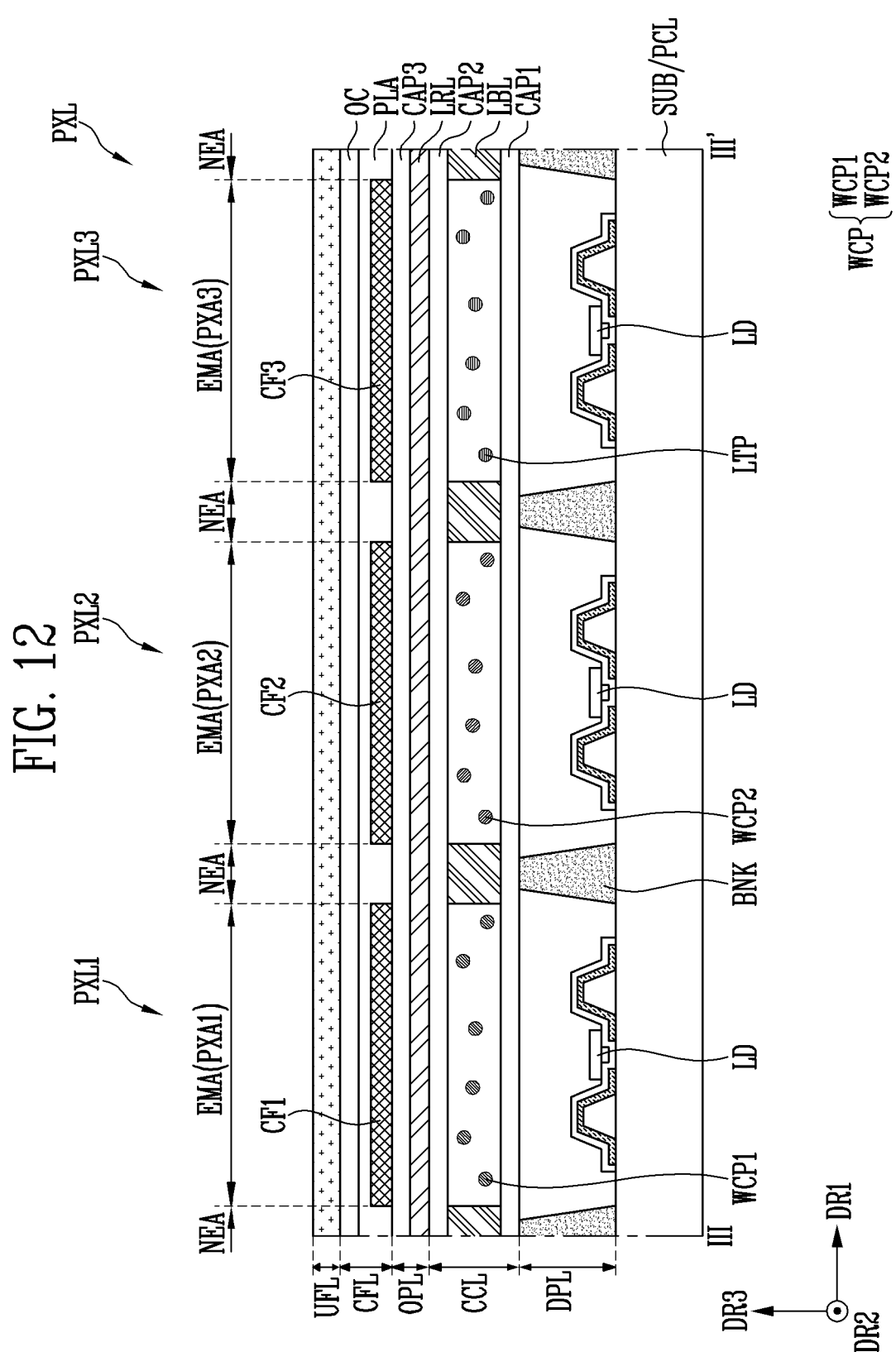

The pixel circuit unit PCL and the display element unit DPL are mainly illustrated in FIG. 9, the display element unit DPL is mainly illustrated in FIG. 10, and a color conversion unit CCL, an optical layer OPL, a color filter unit CFL, and an upper film layer UFL are mainly illustrated in FIGS. 11 and 12.

FIG. 9 is a cross-sectional view taken along the line I-I' of FIG. 7. Referring to FIG. 9, the pixel PXL may include a substrate SUB, a pixel circuit unit PCL, and a display element unit DPL.

The substrate SUB may be provided as a base surface, and the pixel circuit unit PCL and the display element unit DPL may be disposed on the substrate SUB.

The pixel circuit unit PCL may be disposed on the substrate SUB. The pixel circuit unit PCL may include a buffer layer BFL, a transistor TR, a gate insulating layer GI, a first interlayer insulating layer ILD1, a second interlayer insulating layer ILD2, a power line PL, a protective layer PSV, a first contact part CNT1, and a second contact part CNT2.

The buffer layer BFL may be disposed on the substrate SUB. The buffer layer BFL may prevent impurities from being diffused from the outside. The buffer layer BFL may include any one of silicon nitride (SiNx), silicon oxide (SiOx), silicon oxynitride (SiOxNy), and aluminum oxide (AlOx).

The transistor TR may be a thin film transistor. According to one or more embodiments, the transistor TR may be a driving transistor.

The transistor TR may be electrically connected to the light emitting element LD. The transistor TR may be electrically connected to the first electrode ELT1 through the first contact part CNT1.

The transistor TR may include an active layer ACT, a first transistor electrode TE1, a second transistor electrode TE2, and a gate electrode GE.

The active layer ACT may refer to a semiconductor layer. The active layer ACT may be disposed on the buffer layer BFL. The active layer ACT may include at least one of polysilicon, low temperature polycrystaline silicon (LTPS), amorphous silicon, and an oxide semiconductor.

The active layer ACT may include a first contact region in contact with the first transistor electrode TE1 and a second contact region in contact with the second transistor electrode TE2. The first contact region and the second contact region may be a semiconductor pattern doped with impurities. A region between the first contact region and the second contact region may be a channel region. The channel region may be an intrinsic semiconductor pattern that is not doped with impurities.

The gate electrode GE may be disposed on the gate insulating layer GI. A position of the gate electrode GE may correspond to a position of the channel region of the active layer ACT. For example, the gate electrode GE may be disposed on the channel region of the active layer ACT with the gate insulating layer GI interposed therebetween.

The gate insulating layer GI may be disposed on the active layer ACT and the buffer layer BFL. The gate insulating layer GI may include an inorganic material. According to one or more embodiments, the gate insulating layer GI may include at least one of silicon nitride (SiNx), silicon oxide (SiOx), silicon oxynitride (SiOxNy), and aluminum oxide (AlOx).

The first interlayer insulating layer ILD1 may be disposed on the gate electrode GE and the gate insulating layer GI. Like the gate insulating layer GI, the first interlayer insulating layer ILD1 may include at least one of silicon nitride (SiNx), silicon oxide (SiOx), silicon oxynitride (SiOxNy), and aluminum oxide (AlOx).

The first transistor electrode TE1 and the second transistor electrode TE2 may be disposed on the first interlayer insulating layer ILD1. The first transistor electrode TE1 may penetrate the gate insulating layer GI and the first interlayer insulating layer ILD1 to contact the first contact region of the active layer ACT, and the second transistor electrode TE2 may penetrate the gate insulating layer GI and the first interlayer insulating layer ILD1 to contact the second contact region of the active layer ACT. According to one or more embodiments, the first transistor electrode TE1 may be a drain electrode, and the second transistor electrode TE2 may be a source electrode, but is not limited thereto.

The second interlayer insulating layer ILD2 may be disposed on the first transistor electrode TE1 and the second transistor electrode TE2, a power line PL, and the first interlayer insulating layer ILD1. Like the first interlayer insulating layer ILD1 and the gate insulating layer GI, the second interlayer insulating layer ILD2 may include an inorganic material. The inorganic material may include materials exemplified as constituent materials of the first interlayer insulating film ILD1 and the gate insulating film GI, for example, at least one of silicon nitride (SiNx), silicon oxide (SiOx), silicon oxynitride (SiOxNy), and aluminum oxide (AlOx).

The power line PL may be disposed on the first interlayer insulating layer ILD1. The power line PL may be electrically connected to the second electrode ELT2 through the second contact part CNT2 formed by passing through the passivation layer PSV and the second interlayer insulating layer ILD2.

The passivation layer PSV may be disposed on the second interlayer insulating layer ILD2. The passivation layer PSV may be provided in a form including an organic insulating layer, an inorganic insulating layer, or the organic insulating layer disposed on the inorganic insulating layer. According to one or more embodiments, in the passivation layer PSV, a first contact part CNT1 connected to one area of the first transistor electrode TE1 and a second contact part CNT2 connected to one area of the power line PL may be formed.

The display element unit DPL may be disposed on the pixel circuit unit PCL. The display element unit DPL may include a first insulating pattern INP1, a second insulating pattern INP2, a first electrode ELT1, a second electrode ELT2, a first insulating layer INS1, a bank BNK, a light emitting element, a second insulating layer INS2, a first contact electrode CNE1, a second contact electrode CNE2, a third insulating layer INS3, and a fourth insulating layer INS4.

The first insulating pattern INP1 and the second insulating pattern INP2 may be disposed on the passivation layer PSV. The first insulating pattern INP1 and the second insulating pattern INP2 may have a shape protruding in the thickness direction (e.g., the third direction DR3) of the substrate SUB. The first insulating pattern INP1 and the second insulating pattern INP2 may include an organic material or an inorganic material, but are not limited to specific examples.

The first electrode ELT1 and the second electrode ELT2 may be disposed on the passivation layer PSV. According to one or more embodiments, at least a portion of the first electrode ELT1 may be arranged on the first insulating pattern INP1, and at least a portion of the second electrode ELT2 may be arranged on the second insulating pattern INP2, and each thereof may function as a reflective barrier.

The first electrode ELT1 may be electrically connected to the transistor TR through the first contact part CNT1. The second electrode ELT2 may be electrically connected to the power line PL through the second contact part CNT2.

The first electrode ELT1 may be electrically connected to the light emitting element LD. The first electrode ELT1 may be electrically connected to the first contact electrode CNE1 through a contact hole formed in the first insulating layer INS1. The first electrode ELT1 may apply an anode signal to the light emitting element LD.

The second electrode ELT2 may be electrically connected to the light emitting element LD. The second electrode ELT2 may be electrically connected to the second contact electrode CNE2 through a contact hole formed in the first insulating layer INS1. The second electrode ELT2 may apply a cathode signal (e.g., a ground signal) to the light emitting element LD.

The first electrode ELT1 and the second electrode ELT2 may include a conductive material. For example, the first electrode ELT1 and the second electrode ELT2 may include a metal such as silver (Ag), magnesium (Mg), aluminum (AI), platinum (Pt), palladium (Pd), gold (Au), nickel (Ni), neodymium (Nd), iridium (Ir), chromium (Cr), titanium (Ti), and alloys thereof. However, it is not limited to the above-described example.

The first insulating layer INS1 may be disposed on the passivation layer PSV. The first insulating layer INS1 may cover the first electrode ELT1 and the second electrode ELT2. The first insulating layer INS1 may stabilize a connection between electrodes and reduce external influences. The first insulating layer INS1 may include any one of silicon nitride (SiNx), silicon oxide (SiOx), silicon oxynitride (SiOxNy), and aluminum oxide (AlOx).

The bank BNK may be disposed on the first insulating layer INS1. The bank BNK may have a shape protruding in the thickness direction of the substrate SUB, and may be around (or may surround) an area in which the light emitting element LD is disposed. According to one or more embodiments, the bank BNK may define a space in which a fluid can be accommodated.

The light emitting element LD may be disposed on the first insulating layer INS1. The light emitting element LD may emit light based on electrical signals provided from the first contact electrode CNE1 and the second contact electrode CNE2.

The second insulating layer INS2 may be disposed on the light emitting element LD. The second insulating layer INS2 may cover the active layer AL of the light emitting element LD. According to one or more embodiments, the second insulating layer INS2 may include at least one of an organic material or an inorganic material.

The first contact electrode CNE1 and the second contact electrode CNE2 may be disposed on the first insulating layer INS1. The first contact electrode CNE1 may electrically connect the first electrode ELT1 and the light emitting element LD, and the second contact electrode CNE2 may electrically connect the second electrode ELT2 and the light emitting element LD.

The first contact electrode CNE1 and the second contact electrode CNE2 may include a conductive material. According to one or more embodiments, the first contact electrode CNE1 and the second contact electrode CNE2 may include a transparent conductive material including indium tin oxide (ITO), indium zinc oxide (IZO), and indium tin zinc oxide (ITZO), but is not limited thereto.

The third insulating layer INS3 may be disposed on the second contact electrode CNE2. At least a portion of the third insulating layer INS3 may be disposed between the first contact electrode CNE1 and the second contact electrode CNE2 to prevent a short circuit between the first contact electrode CNE1 and the second contact electrode CNE2. According to one or more embodiments, the third insulating layer INS3 may include at least one of silicon nitride (SiNx), silicon oxide (SiOx), silicon oxynitride (SiOxNy), and aluminum oxide (AlOx).

According to one or more embodiments, a portion of the second contact electrode CNE2' may be disposed on the bank BNK. Referring to FIGS. 7 and 9, a portion of the second contact electrode CNE2' may connect a portion of the second contact electrode CNE2 disposed on the second electrode ELT2 and another portion of the second contact electrode CNE2 disposed on the fourth electrode ELT4.

The fourth insulating layer INS4 may be disposed at an outside of the display element unit DPL. The fourth insulating layer INS4 may protect individual components of the display element unit DPL from external influences. According to one or more embodiments, the fourth insulating layer INS4 may include at least one of silicon nitride (SiNx), silicon oxide (SiOx), silicon oxynitride (SiOxNy), and aluminum oxide (AlOx).

Next, a cross-sectional structure of the pixel PXL according to the described embodiment will be described at another side with reference to FIG. 10. Contents that may overlap with the above will be briefly described or omitted.

FIG. 10 is a cross-sectional view taken along the line II-II' of FIG. 7.

In FIGS. 10, the pixel circuit unit PCL is briefly illustrated for convenience of description.

Referring to FIG. 10, the light emitting element LD may be disposed in a way area defined by the third electrode ELT3 and the fourth electrode ELT4.

According to one or more embodiments, the pixel PXL may further include a third insulating pattern INP3. The third insulating pattern INP3 may have a shape protruding in the thickness direction of the substrate SUB. According to one or more embodiments, the third insulating pattern INP3 may include an organic material or an inorganic material, but is not limited to a specific example.

The third electrode ELT3 may be disposed on one surface of the second insulating pattern INP2, and the fourth electrode ELT4 may be disposed on one surface of the third insulating pattern INP3.

The light emitting element LD may be disposed on the first insulating layer INS1 disposed on the third electrode ELT3 and the fourth electrode ELT4.

The second contact electrode CNE2 may be electrically connected to the fourth electrode ELT4, and may be electrically connected to the light emitting element LD disposed on the third electrode ELT3 and the fourth electrode ELT4.

The third contact electrode CNE3 may be electrically connected to the third electrode ELT3, and may be electrically connected to the light emitting element LD disposed on the third electrode ELT3 and the fourth electrode ELT4.

Hereinafter, with reference to FIG. 11, for the pixel PXL according to the described embodiment, the color conversion unit CCL, the optical layer OPL, the color filter unit CFL, and the upper film layer UFL will be mainly described.

FIG. 11 is a cross-sectional view illustrating a structure of a pixel PXL according to one or more embodiments, and FIG. 12 is a cross-sectional view illustrating a structure of a pixel PXL according to one or more embodiments.

FIGS. 11 and 12 are cross-sectional views taken along the line III-III' of FIG. 3.

According to one or more embodiments, the light emitting elements LD disposed in each of the first pixel PXL1, the second pixel PXL2, and the third pixel PXL3 may emit light of the same color. For example, the first pixel PXL1, the second pixel PXL2, and the third pixel PXL3 may include light emitting elements LD that emit light of a third color, for example, blue light. A color conversion unit CCL and/or a color filter unit CFL may be provided to the first pixel PXL1, the second pixel PXL2, and the third pixel PXL3 to display a full-color image. However, the present disclosure is not limited thereto, and the first pixel PXL1, the second pixel PXL2, and the third pixel PXL3 may include light emitting elements LD that emit light of different colors.

According to one or more embodiments, the bank BNK may define a light emitting area EMA and a non-light emitting area NEA. For example, the bank BNK may be provided to be around (or surround) the light emitting area EMA. The bank BNK may overlap the non-light emitting area NEA when viewed in a plan view.

According to one or more embodiments, the color conversion unit CCL may be disposed on the same layer as the display element unit DPL. For example, the color conversion unit CCL may be disposed between the banks BNK.

The color conversion unit CCL may include a wavelength conversion pattern WCP, a light transmission pattern LTP, and a first capping layer CAP1. According to one or more embodiments, the wavelength conversion pattern WCP may include a first wavelength conversion pattern WCP1 and a second wavelength conversion pattern WCP2.

The first wavelength conversion pattern WCP1 may be disposed to overlap the light emitting area EMA of the first pixel PXL1. For example, the first wavelength conversion pattern WCP1 may be provided between the banks BNK and may overlap the light emitting area EMA of the first pixel PXL1 when viewed in a plan view.

The second wavelength conversion pattern WCP2 may be disposed to overlap the light emitting area EMA of the second pixel PXL2. For example, the second wavelength conversion pattern WCP2 may be provided between the banks BNK and may overlap the light emitting area EMA of the second pixel PXL2 when viewed in a plan view.

The light transmission pattern LTP may be disposed to overlap the light emitting area EMA of the third pixel PXL3. For example, the light transmission pattern LTP may be provided between the banks BNK and may overlap the light emitting area EMA of the third pixel PXL3 when viewed in a plan view.

According to one or more embodiments, the first wavelength conversion pattern WCP1 may include first color conversion particles that convert light of the third color emitted from the light emitting element LD into light of the first color. For example, when the light emitting element LD is a blue light emitting element emitting blue light and the first pixel PXL1 is a red pixel, the first wavelength conversion pattern WCP1 may include a first quantum dot that converts blue light emitted from the blue light emitting element into red light.

For example, the first wavelength conversion pattern WCP1 may include a plurality of first quantum dots dispersed in a suitable matrix material (e.g., a set or predetermined matrix material) such as a base resin. The first quantum dot may absorb blue light and shift a wavelength according to an energy transition to emit red light. In one or more embodiments, when the first pixel PXL1 is a pixel of a different color, the first wavelength conversion pattern WCP1 may include a first quantum dot corresponding to a color of the first pixel PXL1.

According to one or more embodiments, the second wavelength conversion pattern WCP2 may include second color conversion particles that convert light of the third color emitted from the light emitting element LD into light of the second color. For example, when the light emitting element LD is a blue light emitting element emitting blue light and the second pixel PXL2 is a green pixel, the second wavelength conversion pattern WCP2 may include a second quantum dot that converts blue light emitted from the blue light emitting element into green.

For example, the second wavelength conversion pattern WCP2 may include a plurality of second quantum dots dispersed in a suitable matrix material (e.g., a set or predetermined matrix material) such as a base resin. The second quantum dot may absorb blue light and shift a wavelength according to an energy transition to emit green light. In one or more embodiments, when the second pixel PXL2 is a pixel of a different color, the second wavelength conversion pattern WCP2 may include a second quantum dot corresponding to a color of the second pixel PXL2.

In one or more embodiments, the first quantum dot and the second quantum dot may have shapes of spherical, pyramidal, multi-arm, or cubic nanoparticles, nanotubes, nanowires, nanofibers, nanoplatelet particles, and the like, but is not necessarily limited thereto, and shapes of the first quantum dot and the second quantum dot may be variously changed.

In one or more embodiments, the absorption coefficient of the first quantum dot and the second quantum dot may be increased by injecting blue light having a relatively short wavelength in the visible light range to the first quantum dot and the second quantum dot. Accordingly, the light efficiency emitted from the first pixel PXL1 and the second pixel PXL2 may be improved, and excellent color reproducibility may be secured finally. In addition, the pixel unit of the first to third pixels PXL1, PXL2, and PXL3 may be composed of the light-emitting elements LD (e.g., blue light-emitting elements) of the same color, thereby manufacturing efficiency of the display device can be increased.

According to one or more embodiments, the light transmission pattern LTP may be provided to efficiently use the light of the third color emitted from the light emitting element LD. For example, when the light emitting element LD is a blue light emitting element emitting blue light and the third pixel PXL3 is a blue pixel, the light transmission pattern LTP may include at least one type of light scattering particles to efficiently use light emitted from the light emitting element LD.

For example, the light transmission pattern LTP may include a plurality of light scattering particles dispersed in a suitable matrix material (e.g., a predetermined matrix material) such as a base resin. For example, the light transmission pattern LTP may include light scattering particles such as silica, but the material of the light scattering particles is not limited thereto.

In one or more embodiments, the light scattering particles do not have to be disposed only in the light emitting area EMA of the third pixel PXL3. For example, the light scattering particles may be selectively included in the first and/or second wavelength conversion patterns WCP1 and WCP2.

According to one or more embodiments, the light emitting area EMA of the first pixel PXL1 may overlap the first pixel area PXA1 when viewed in a plan view. The first pixel area PXA1 may mean an area from which the first color is emitted.

According to one or more embodiments, the light emitting area EMA of the second pixel PXL2 may overlap the second pixel area PXA2 when viewed in a plan view. The second pixel area PXA2 may mean an area from which the second color is emitted.

According to one or more embodiments, the light emitting area EMA of the third pixel PXL3 may overlap the third pixel area PXA3 when viewed in a plan view. The third pixel area PXA3 may mean an area from which the third color is emitted.

The first capping layer CAP1 may seal (or cover) the wavelength conversion pattern WCP and the light transmission pattern LTP. The first capping layer CAP1 may be disposed between a low refractive index layer LRL and the display element unit DPL. The first capping layer CAP1 may be provided over the first to third pixels PXL1, PXL2, and PXL3. The first capping layer CAP1 may prevent impurities such as moisture or air from penetrating from the outside damaging or contaminating the color conversion unit CCL.

According to one or more embodiments, the first capping layer CAP1 may be composed of a single layer or multiple layers, including at least one insulating material selected from silicon oxide (SiOx), silicon nitride (SiNx), silicon oxynitride (SiOxNy), aluminum oxide (AlOx), and titanium oxide (TiOx), but is not limited thereto.

The optical layer OPL may include a low refractive index layer LRL and a second capping layer CAP2. The optical layer OPL may be disposed on the color conversion unit CCL. The optical layer OPL may be disposed on the display element unit DPL.

The low refractive index layer LRL may be disposed between the first capping layer CAP1 and the second capping layer CAP2. The low refractive index layer LRL may be disposed between the color conversion unit CCL and the color filter unit CFL. The low refractive index layer LRL may be provided over the first to third pixels PXL1, PXL2, and PXL3.

The low refractive index layer LRL may improve light efficiency by recycling light provided from the color conversion unit CCL by total reflection. To this end, the low refractive index layer LRL may have a relatively lower refractive index than that of the color conversion unit CCL.

According to one or more embodiments, the low refractive index layer LRL may include a base resin and hollow particles dispersed in the base resin. The hollow particles may include hollow silica particles. Alternatively, the hollow particles may be pores formed by porogen, but is not necessarily limited thereto. In addition, the low refractive index layer LRL may include at least one of zinc oxide (ZnO) particles, titanium dioxide (TiO2) particles, and nano silicate particles, but is not limited thereto.

The second capping layer CAP2 may be disposed on the low refractive index layer LRL. The second capping layer CAP2 may be disposed between the color filter unit CFL and the low refractive index layer LRL. The second capping layer CAP2 may be provided over the first to third pixels PXL1, PXL2, and PXL3. The second capping layer CAP2 may prevent impurities such as moisture or air from penetrating from the outside damaging or contaminating the low refractive index layer LRL.

According to one or more embodiments, the second capping layer CAP2 may be composed of a single layer or multiple layers, including at least one insulating material selected from silicon oxide (SiOx), silicon nitride (SiNx), silicon oxynitride (SiOxNy), aluminum oxide (AlOx), and titanium oxide (TiOx), but is not limited thereto.

The color filter unit CFL may be disposed on the second capping layer CAP2. The color filter unit CFL may be provided over the first to third pixels PXL1, PXL2, and PXL3. The color filter unit CFL may include color filters CF1, CF2, and CF3, a planarization layer PLA, and an overcoat layer OC.

According to one or more embodiments, the color filters CF1, CF2, and CF3 may be disposed on the second capping layer CAP2. The color filters CF1, CF2, and CF3 may overlap the light emitting area EMA of the first to third pixels PXL1, PXL2, and PXL3 when viewed in a plan view.

According to one or more embodiments, the color filters CF1, CF2, and CF3 may overlap the first to third pixel areas PXA1, PXA2, and PXA3.

According to one or more embodiments, the first color filter CF1 may transmit the light of the first color, but may not transmit the light of the second color and the light of the third color. For example, the first color filter CF1 may include a colorant related to the first color. According to one or more embodiments, the first color filter CF1 may overlap the first pixel area PXA1 in the third direction DR3 when viewed in a plan view.

According to one or more embodiments, the second color filter CF2 may transmit the light of the second color, but may not transmit the light of the first color and the light of the third color. For example, the second color filter CF2 may include a colorant related to the second color. According to one or more embodiments, the second color filter CF2 may overlap the second pixel area PXA2 when viewed in a plan view.

According to one or more embodiments, the third color filter CF3 may transmit the light of the third color, but may not transmit the light of the first color and the light of the second color. For example, the third color filter CF3 may include a colorant related to the third color. According to one or more embodiments, the third color filter CF3 may overlap the third pixel area PXA3 when viewed in a plan view.

According to one or more embodiments, the planarization layer PLA may be disposed on the color filters CF1, CF2, and CF3. The planarization layer PLA may cover the color filters CF1, CF2, and CF3. The planarization layer PLA may cancel a step difference caused by the color filters CF1, CF2, and CF3. The planarization layer PLA may be provided over the first to third pixels PXL1, PXL2, and PXL3.

According to one or more embodiments, the planarization layer PLA may include an organic material such as acrylates resin, epoxy resin, phenolic resin, polyamides resin, polyimides rein, polyesters resin, polyphenylenesulfides resin, or benzocyclobutene (BCB). However, the present disclosure is not necessarily limited thereto, and the planarization layer PLA may include an inorganic material such as silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The overcoat layer OC may be disposed on the planarization layer PLA. The overcoat layer OC may be disposed between the upper film layer UFL and the color filter unit CFL. The overcoat layer OC may be provided over the first to third pixels PXL1, PXL2, and PXL3. The overcoat layer OC may cover a lower member including the color filter unit CFL. The overcoat layer OC may prevent moisture or air from penetrating into the above-described lower member. In addition, the overcoat layer OC may protect the above-described lower member from foreign substances such as dust.

According to the described embodiment, the overcoat layer OC may include an organic material such as acrylates resin, epoxy resin, phenolic resin, polyamides resin, poly-imides rein, polyesters resin, polyphenylenesulfides resin, or benzocyclobutene (BCB). However, the present disclosure is not necessarily limited thereto, and the overcoat layer OC may include an inorganic material such as silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The upper film layer UFL may be disposed on the color filter unit CFL. The upper film layer UFL may be disposed at an outside of the display device DD to reduce external influence on the display device DD. The upper film layer UFL may be provided over the first to third pixels PXL1, PXL2, and PXL3.

According to one or more embodiments, the upper film layer UFL may include an AR (anti-reflective) coating layer. The AR coating layer may refer to a configuration in which a material having an antireflection function is applied to one surface of a specific configuration. Here, the applied material may have a low reflectance. According to one or more embodiments, the material used for the AR coating layer may include any one of SiOx, ZiOx, AlxOy, and TiOx. However, the present disclosure is not limited thereto, and various conventionally known materials may be applied.

Next, the structure of the pixel PXL according to one or more embodiments will be described.

Referring to FIG. 12, the pixel PXL according to one or more embodiments may be different from the pixel PXL (refer to FIG. 11) according to the above-described embodiment in that the color conversion unit CCL is disposed on a different layer from the display element unit DPL.

According to the present embodiment, the color conversion unit CCL may be disposed on the display element unit DPL. For example, the first capping layer CAP1 may seal (or cover) an area on which the light emitting elements LD are disposed, and the color conversion unit CCL may be disposed on the first capping layer CAP1.

According to the present embodiment, the color conversion unit CCL may further include a light blocking layer LBL. The light blocking layer LBL may be disposed on the display element unit DPL. The light blocking layer LBL may be disposed between the first capping layer CAP1 and the second capping layer CAP2. The light blocking layer LBL may be disposed to be around (or to surround) the first wavelength conversion pattern WCP1, the second wavelength conversion pattern WCP2, and the light transmission pattern LTP at a boundary between the first to third pixels PXL1, PXL2, and PXL3.

The light blocking layer LBL may define the light emitting area EMA and the non-light emitting area NEA of the pixel PXL. For example, the light blocking layer LBL may not overlap the light emitting area EMA when viewed in a plan view. The light blocking layer LBL may overlap the non-light emitting area NEA when viewed in a plan view. According to one or more embodiments, the area in which the light blocking layer LBL is not disposed may be defined as the light emitting area EMA of the first to third pixels PXL1, PXL2, and PXL3.

According to one or more embodiments, the first to third pixel areas PXA1, PXA2, and PXA3 may be defined by the color conversion unit CCL. For example, the light blocking layer LBL may define the first to third pixel areas PXA1, PXA2, and PXA3. For example, the first pixel area PXA1 may be an area between the light blocking layers LBL and may be an area in which the first wavelength conversion pattern WCP1 is disposed. The second pixel area PXA2 may be an area between the light blocking layers LBL and may be an area in which the second wavelength conversion pattern WCP2 is disposed. The third pixel area PXA3 may be an area between the light blocking layers LBL and may be an area in which the light transmission pattern LTP is disposed.

According to one or more embodiments, the light blocking layer LBL may be formed of an organic material including at least one of graphite, carbon black, black pigment, or black dye, or may be formed of a metal material including chromium (Cr), but is not limited as long as it is a material capable of blocking and absorbing light.

According to the present embodiment, the second capping layer CAP2 may seal (or cover) the first wavelength conversion pattern WCP1, the second wavelength conversion pattern WCP2, and the light transmission pattern LTP.

According to the present embodiment, the low refractive index layer LRL may be disposed between the second capping layer CAP2 and the third capping layer CAP3. Like the first capping layer CAP1 and the second capping layer CAP2, the third capping layer CAP3 may be composed of a single layer or multiple layers, including at least one insulating material selected from silicon oxide (SiOx), silicon nitride (SiNx), silicon oxynitride (SiOxNy), or aluminum oxide (AlOx), and titanium oxide (TiOx), but is not limited thereto.

The structure of the pixel PXL is not limited to the structure described above with reference to FIGS. 9 to 12, and may be implemented as various arrangement relationships of the components according to embodiments.

Hereinafter, the arrangement relationship between the first extension area 120, the second extension area 140, and the first to third pixel areas PXA1, PXA2, and PXA3 will be described with reference to FIG. 13.

Figure 13:
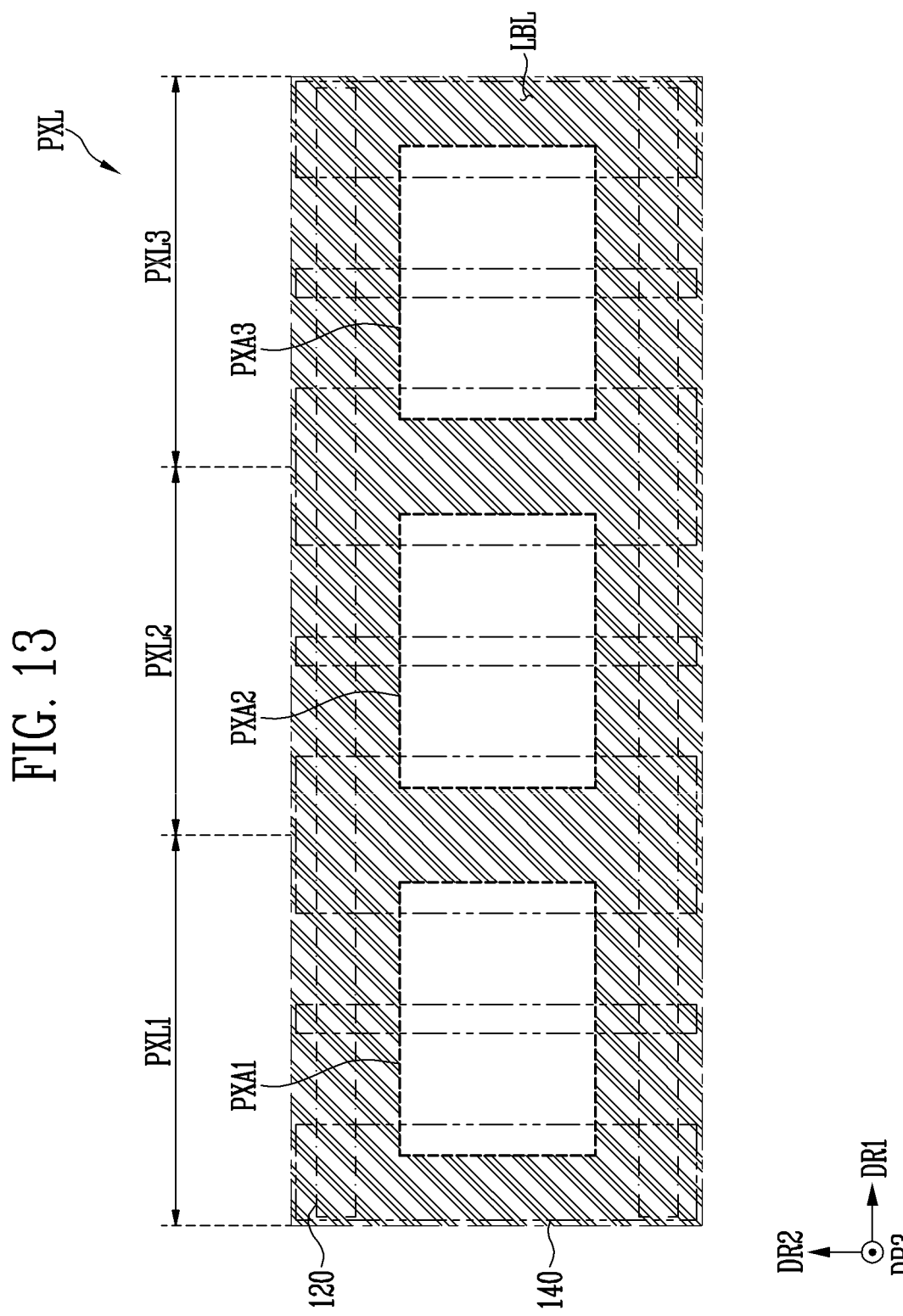
FIG. 13 is a plan view of a pixel according to one or more embodiments with focus on first to third pixel areas.

FIG. 13 is a plan view of a pixel according to one or more embodiments, illustrating centering on first to third pixel areas.

Referring to FIG. 13, the first pixel area PXA1, the second pixel area PXA2, and the third pixel area PXA3 may be sequentially arranged along the first direction DR1.

According to one or more embodiments, the first extension area 120 may be provided over the first to third pixel areas PXA1, PXA2, and PXA3.

According to one or more embodiments, the first to third pixel areas PXA1, PXA2, and PXA3 may not overlap the first extension area 120 when viewed in a plan view. For example, the first to third pixel areas PXA1, PXA2, and PXA3 may be disposed between the first extension area 120 disposed on one side and the first extension area 120 disposed on the other side in the second direction DR2.

According to one or more embodiments, the first to third pixel areas PXA1, PXA2, and PXA3 may overlap the first extension area 120 in the second direction DR2.

According to one or more embodiments, the first to third pixel areas PXA1, PXA2, and PXA3 may overlap the second extension area 140. For example, the first pixel area PXA1 may overlap at least a portion of the second extension area 140 in the second direction DR2. The second pixel area PXA2 may overlap at least a portion of the second extension area 140 in the second direction DR2. The third pixel area PXA3 may overlap at least a portion of the second extension area 140 in the second direction DR2.

Hereinafter, a manufacturing method of the display device DD according to the described embodiment will be described with reference to FIGS. 14 to 22. In FIGS. 14 to 22, individual configurations of the display element unit DPL will be mainly described.

FIGS. 14 to 22 are cross-sectional views illustrating a manufacturing method of a display device according to one or more embodiments.

FIGS. 14, 16, 18, 20, 21, and 22 are cross-sectional views at each process step centering on a structure corresponding to a cross-sectional view taken along the line II-II' of FIG. 7.

Figure 15:
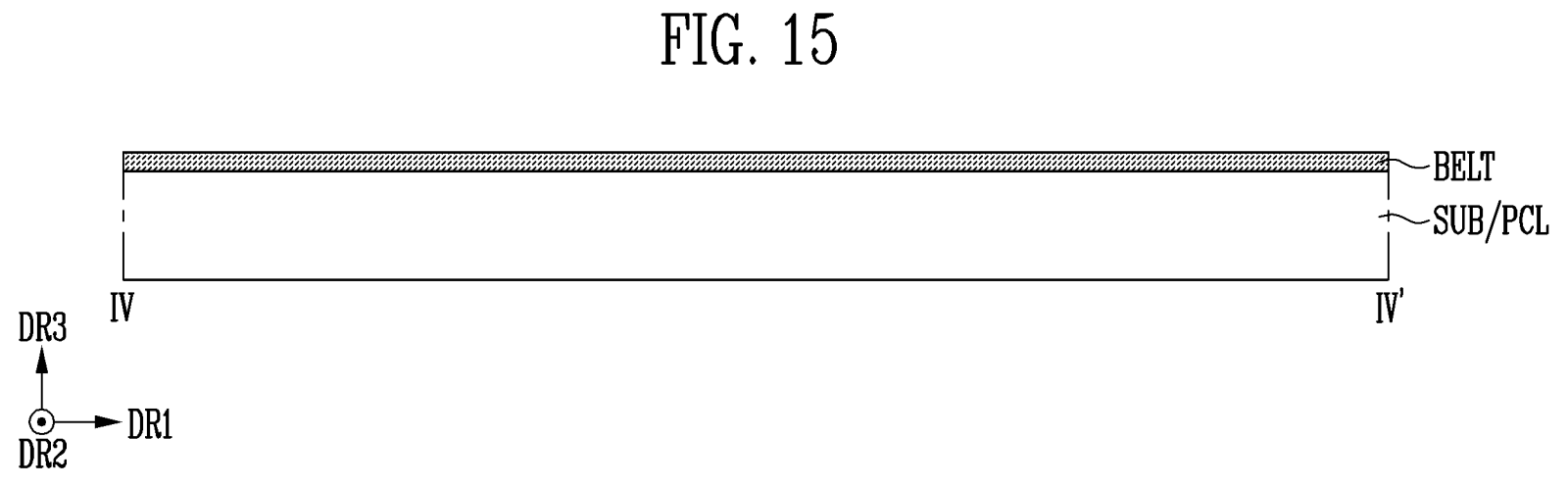
Figure 17:
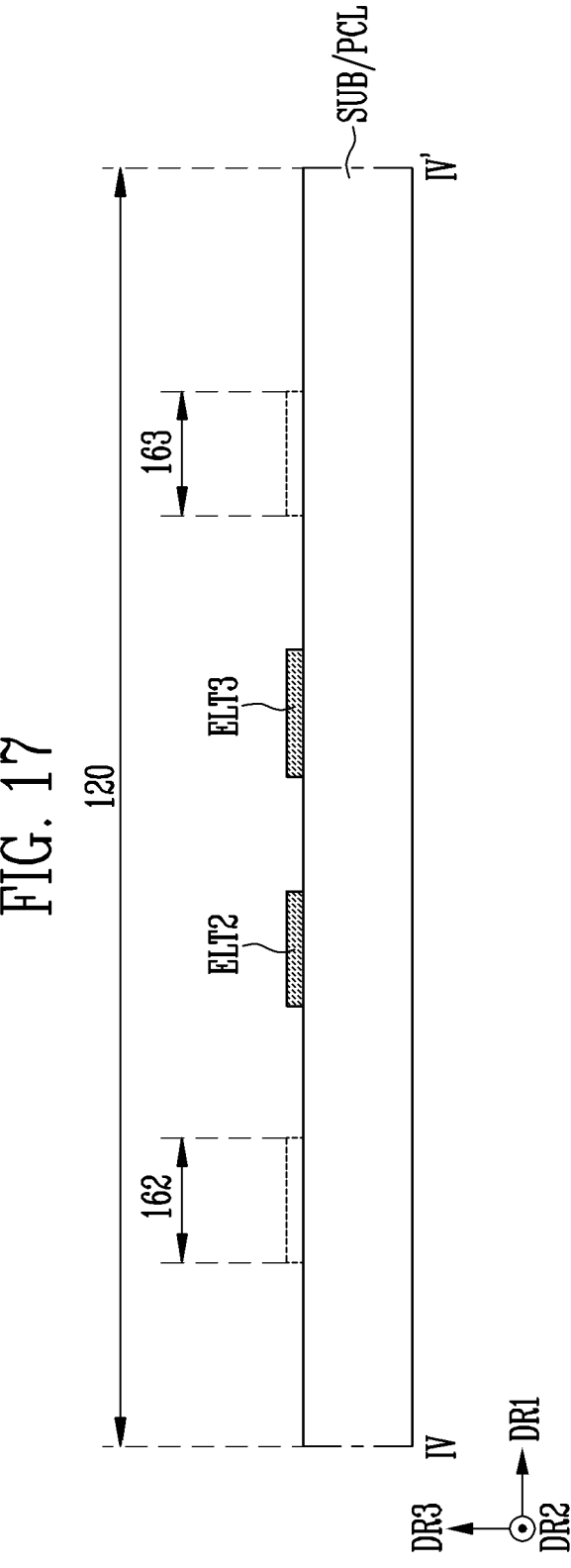
Figure 19:
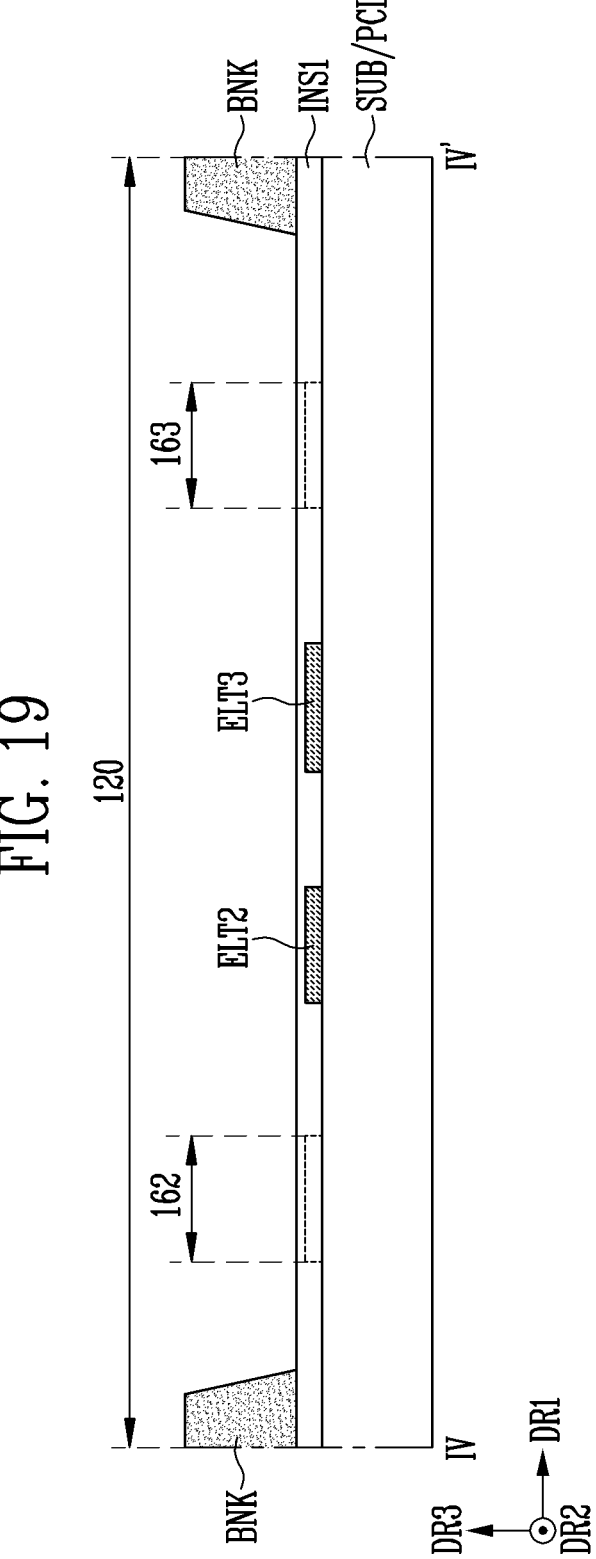

FIGS. 15, 17, and 19 are cross-sectional views at each process step centering on a structure corresponding to a cross-sectional view taken along the line IV-IV' of FIG. 7.

Figure 14:
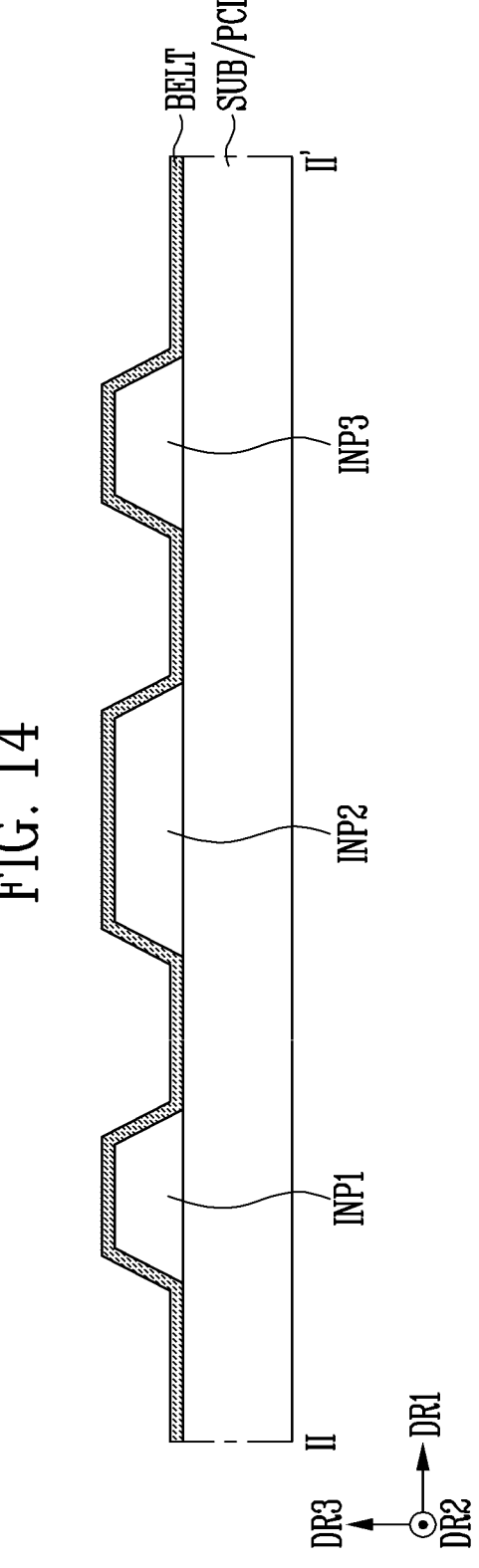

Referring to FIGS. 14 and 15, a substrate SUB may be provided, and a pixel circuit unit PCL may be disposed on the substrate SUB. In addition, the first insulating pattern INP1, the second insulating pattern INP2, and the third insulating pattern INP3 may be disposed on the pixel circuit unit PCL, and the base electrode BELT may be disposed to cover the first insulating pattern INP1, the second insulating pattern INP2, and the third insulating pattern INP3.

In this step, individual components of the pixel circuit unit PCL disposed on the substrate SUB may be formed by patterning a conductive layer (or a metal layer), an inorganic material, or an organic material, and the like by performing a process using a mask.

In this step, the first insulating pattern INP1, the second insulating pattern INP2, and the third insulating pattern INP3 may be formed (or deposited) on the pixel circuit unit PCL. According to one or more embodiments, the first insulating pattern INP1, the second insulating pattern INP2, and the third insulating pattern INP3 may have a shape protruding in the thickness direction (e.g., the third direction DR3) of the substrate SUB so that a reflective surface may be formed thereon.

In this step, the base electrode BELT may be formed (or deposited) on the entire surface of the pixel circuit unit PCL. For example, referring to FIG. 14, the base electrode BELT may be formed on the first insulating pattern INP1 and the second insulating pattern INP2, and referring to FIG. 15, the base electrode BELT may be disposed in an area in which the first insulating pattern INP1, the second insulating pattern INP2, and the third insulating pattern INP3 are not disposed.

Figure 16:
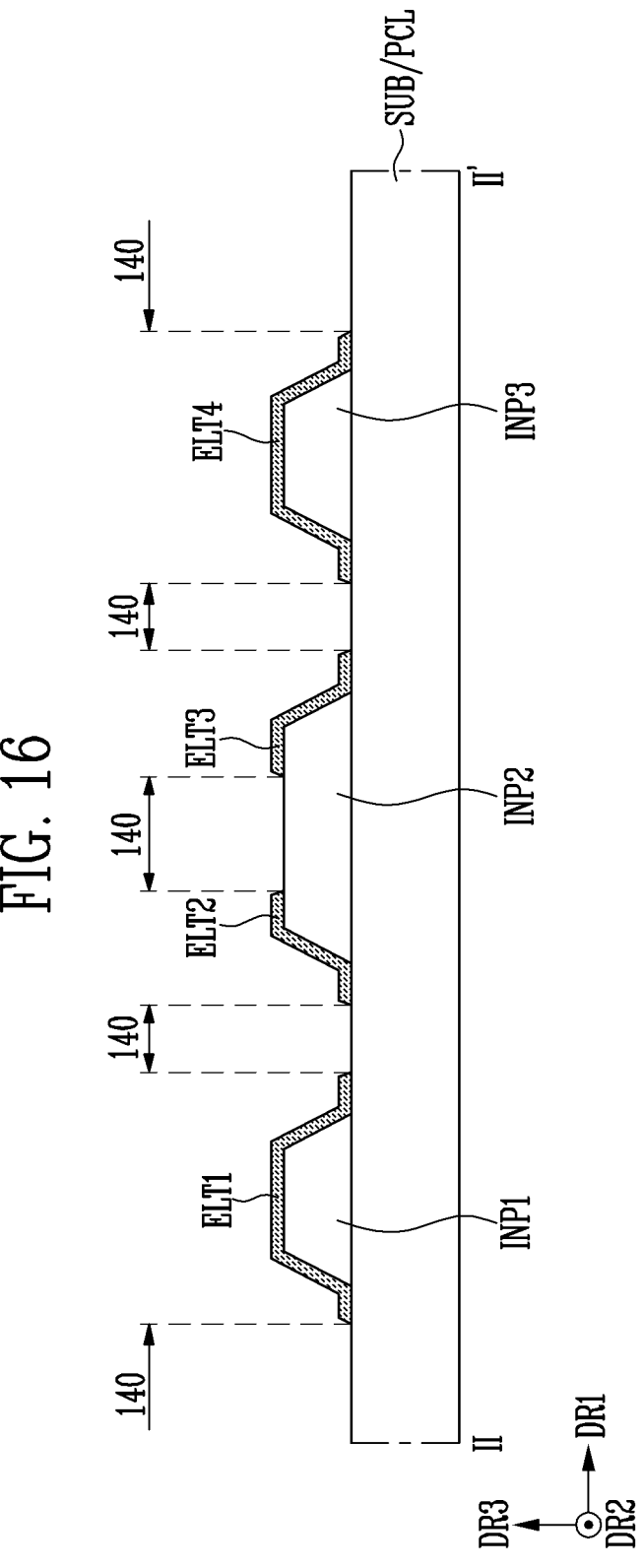

Referring to FIGS. 16 and 17, at least a portion of the base electrode BELT may be removed. The first electrode ELT1, the second electrode ELT2, the third electrode ELT3, and the fourth electrode ELT4 may be provided by etching the base electrode BELT.

In this step, at least a portion of the base electrode BELT may be etched to expose the pixel circuit unit PCL. For example, the base electrode BELT may be etched using a dry etching method.

In this step, the provided first and second electrodes ELT1 and ELT2 may be formed to cover the first insulating pattern INP1 and the second insulating pattern INP2, respectively. Accordingly, in this step, at least a portion of the first electrode ELT1 and the second electrode ELT2 may be provided as a reflective barrier rib.

In this step, the provided third and fourth electrodes ELT3 and ELT4 may be formed to cover the second insulating pattern INP2 and the third insulating pattern INP3, respectively. Accordingly, in this step, at least a portion of the third electrode ELT3 and the fourth electrode ELT4 may be provided as a reflective barrier.

Referring to FIG. 7, in this step, a first upper adjacent electrode UAEL1, a first lower adjacent electrode BAEL1, a second upper adjacent electrode UAEL2, and a second lower adjacent electrode BAEL2 may be further provided.

According to one or more embodiments, the first electrode ELT1, the second electrode ELT2, the third electrode ELT3, the fourth electrode ELT4, the first upper adjacent electrode UAEL1, and the first lower adjacent electrode BAEL1, the second upper adjacent electrode UAEL2, and the second lower adjacent electrode BAEL2 may be formed at the same time.

In this step, a first extension area 120 including a first separation area 162 and a lower separation area 164 may be provided by etching the base electrode BELT. (Refer to FIG. 17)

In this step, referring to FIGS. 16 and 17, the first electrode ELT1 and the fourth electrode ELT4 may be provided not to overlap the first extension area 120, but the second electrode ELT2 and the third electrode ELT2 ELT3 may be provided to overlap the first extension area 120. According to one or more embodiments, the second electrode ELT2 and the third electrode ELT3 in the first extension area 120 may not be removed.

In this step, referring to FIG. 16, the first to fourth electrodes ELT1 to ELT4 may be provided not to overlap the second extension area 140. For example, the second extension area 140 in which the first to fourth electrodes ELT1 to ELT4 are not disposed may be provided by etching the base electrode BELT. In this case, the second extension area 140 may be formed in the second direction DR2.

In this step, the first extension area 120 and the second extension area 140 may be formed (or provided) at the same time.

Referring to FIG. 6, in this step, the first extension area 120 and the second extension area 140 may overlap each other in a plurality of overlapping areas 300 to form a lattice structure.

Referring to FIG. 17 in conjunction with FIG. 7, a portion of the base electrode BELT disposed in the area corresponding to the first separation area 162 and a portion of the base electrode BELT disposed in the area corresponding to the second separation area 163 may be removed.

In this step, the first electrode ELT1 may be spaced from (or electrically separated from) the first upper adjacent electrode UAEL1 and the first lower adjacent electrode BAEL1, and the fourth electrode ELT4 may be spaced from (or electrically separated from) the second upper adjacent electrode UAEL2 and the second lower adjacent electrode BAEL2. Accordingly, the first to fourth electrodes ELT1 to ELT4 may operate normally as alignment electrodes for the light emitting element LD.

According to one or more embodiments, forming the first extension area 120 and the second extension area 140 may be performed in a single process. For example, the process of removing (or etching) the base electrode BELT to form the first extension area 120 may be performed at the same time as the process of removing the base electrode BELT to form the second extension area 140.

As described above, the first extension area 120 and the second extension area 140 may provide a lattice structure when viewed in a plan view. For example, the first extension area 120 and the second extension area 140 may be provided by etching the base electrode BELT to be around (or to surround) at least a portion of the first to third pixel areas PXA1, PXA2, and PXA3. In this case, the process for forming the first extension area 120 and the process for forming the second extension area 140 may be provided in a single process, so that need for an additional mask can be prevented, and thus the process cost can be reduced.

In addition, according to the described embodiment, the number of steps of a repair process for the display device DD can be reduced, and thus the process cost can also be reduced. For example, to arrange the light emitting elements LD, the first electrode ELT1 and the fourth electrode ELT4 need to be spaced from (or electrically separated from) other adjacent electrode (e.g., the first and second upper adjacent electrodes UAEL1 and UAEL2, and the first and second lower adjacent electrodes BAEL1 and BAEL2).

Experimentally, to clarify that the first electrode ELT1 and the fourth electrode ELT4 are electrically separated from another component after performing a process of separating the first electrode ELT1 and the fourth electrode ELT4 from the other electrodes, a process of confirming that foreign substances are not disposed in an area in which the first electrode ELT1 and the fourth electrode ELT4 are separated and an area adjacent thereto may be performed several times. However, according to the described embodiment, a redundant repair process may not be required by etching collectively the base electrode BELT, and forming the first extension area 120 and the second extension area 140 for the area adjacent to the first to fourth electrodes ELT1 to ELT4 serving as alignment electrodes for the light emitting element LD. Accordingly, the reliability of the connection structure of the electrode may be improved, and the process cost may be reduced.

Figure 18:
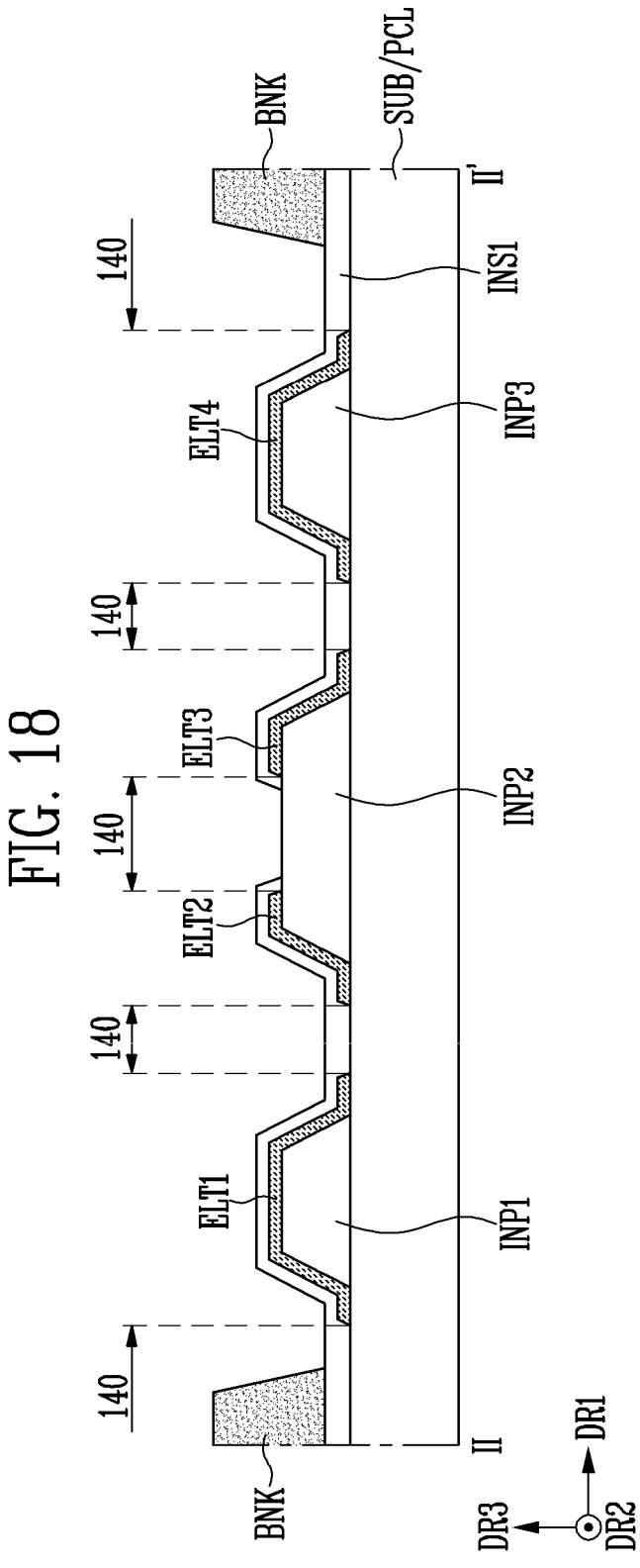

Subsequently, referring to FIGS. 18 and 19, the first insulating layer INS1 may be disposed on the first to fourth electrodes ELT1 to ELT4, and the bank BNK may be disposed on the first insulating layer INS1.

In this step, the first insulating layer INS1 may be formed (or deposited) to cover the first to fourth electrodes ELT1 to ELT4.

In this step, the bank BNK may be formed on the first insulating layer INS1 to define a space in which the fluid may be accommodated. For example, referring to FIG. 18, the bank BNK may be formed to be around (or to surround) a first way area on the first electrode ELT1 and the second electrode ELT2 and a second way area on the third electrode ELT3 and the fourth electrode ELT4.

Figure 20:
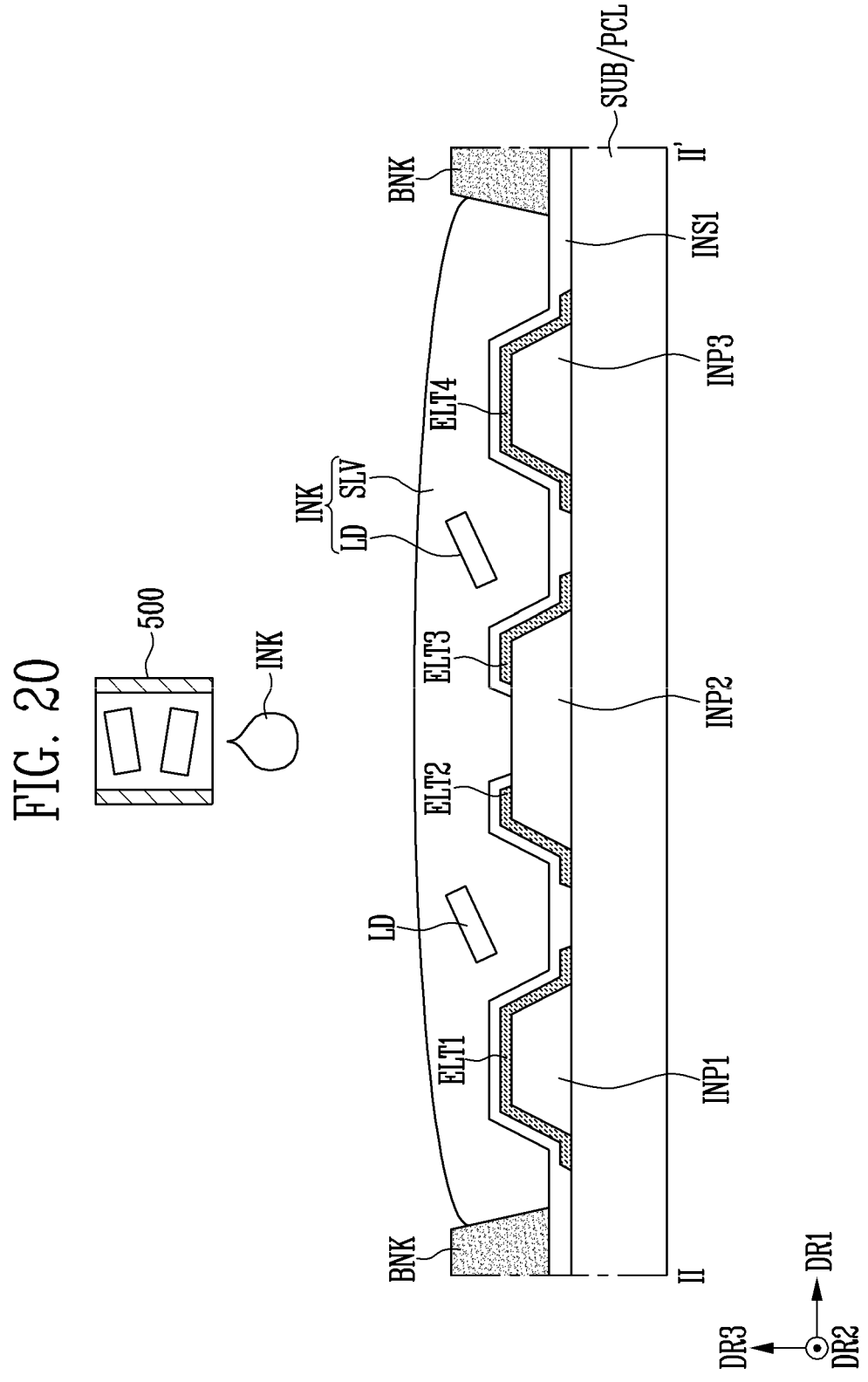

Referring to FIG. 20, an ink INK may be provided on the substrate SUB. The ink INK may be provided by a printing apparatus 500 capable of providing (or jetting) a fluid.

According to one or more embodiments, the printing apparatus 500 may include a nozzle unit configured to discharge the liquid fluid to the outside. The ink INK defined in the present specification may mean a liquid mixture capable of being discharged by the printing apparatus 500.

In this step, the printing apparatus 500 may eject the ink INK in an area in which the light emitting elements LD are to be arranged.

According to one or more embodiments, the ink INK may include a solvent SLV and the light emitting element LD. A plurality of light emitting elements LD may be provided to be dispersed in the solvent SLV having a fluid property. According to one or more embodiments, the solvent SLV may refer to a material other than a solid phase and a material that allows the light emitting element LD to be dispersed.

In this step, the ink INK may be accommodated in a suitable area (e.g., a set or predetermined area). For example, the ink INK may be provided in an area (or space) defined by the bank BNK.

In this step, the light emitting elements LD may be provided to face randomly.

Figure 21:
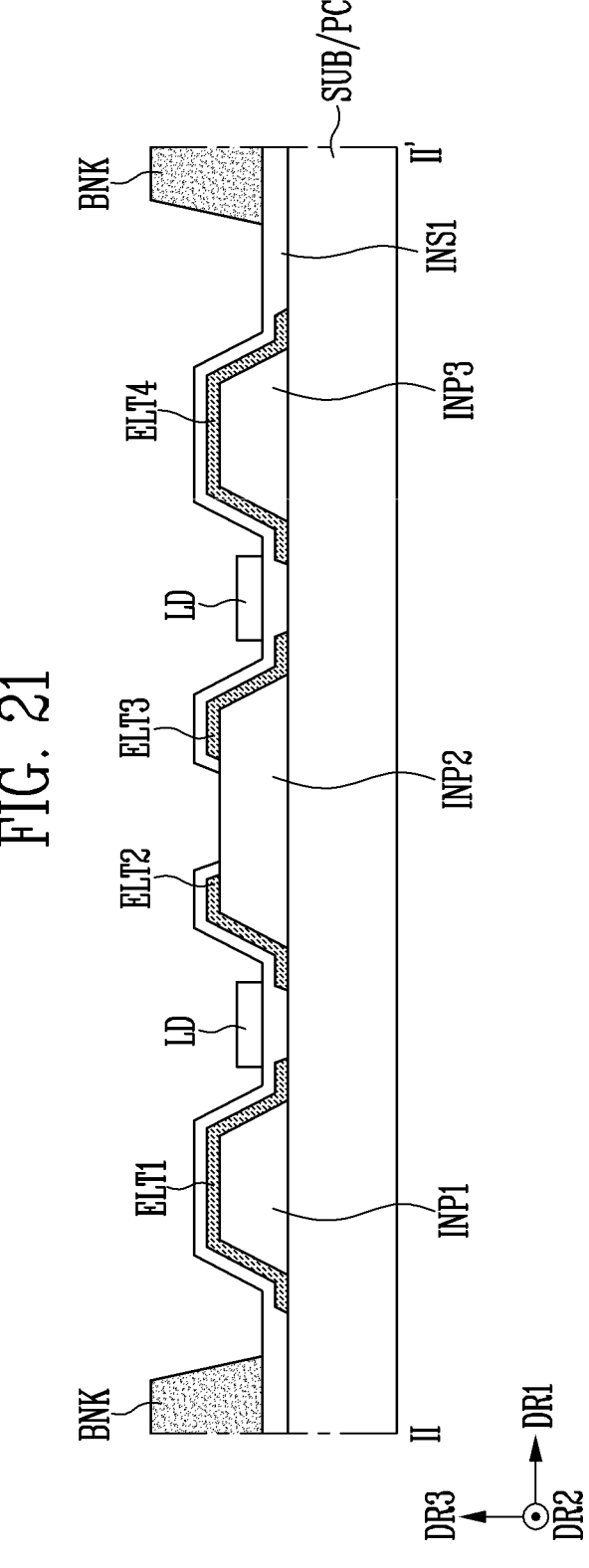

Referring to FIG. 21, the light emitting element LD may be arranged between the first electrode ELT1 and the second electrode ELT2 or between the third electrode ELT3 and the fourth electrode ELT4.

In this step, the light emitting element LD may be moved to an area to be disposed by a dielectrophoresis (DEP) force generated based on electrical signals provided to the first electrode ELT1 and the second electrode ELT2. Accordingly, the light emitting element LD may be disposed between the first electrode ELT1 and the second electrode ELT2.

In this step, an electric signal may be provided to the first electrode ELT1 and the second electrode ELT2 to form an electric field between the first electrode ELT1 and the second electrode ELT2.

According to one or more embodiments, a first electrical signal may be provided to the first electrode ELT1, and a second electrical signal may be provided to the second electrode ELT2. In addition, the light emitting elements LD may be arranged based on the electric field due to the first electrical signal and the second electrical signal. For example, the first electrical signal and the second electrical signal may be AC signals, and may be any one of a sine wave, a triangular wave, a staircase wave, a square wave, a trapezoidal wave, and a pulse wave. However, it is not limited to a specific example.

As described above, the light emitting element LD may be arranged between the third electrode ELT3 and the fourth electrode ELT4. For example, a third electrical signal may be provided to the third electrode ELT3, and a fourth electrical signal may be provided to the fourth electrode ELT4. In this case, the light emitting elements LD may be arranged based on an electric field due to the third electrical signal and the fourth electrical signal.

Figure 22:
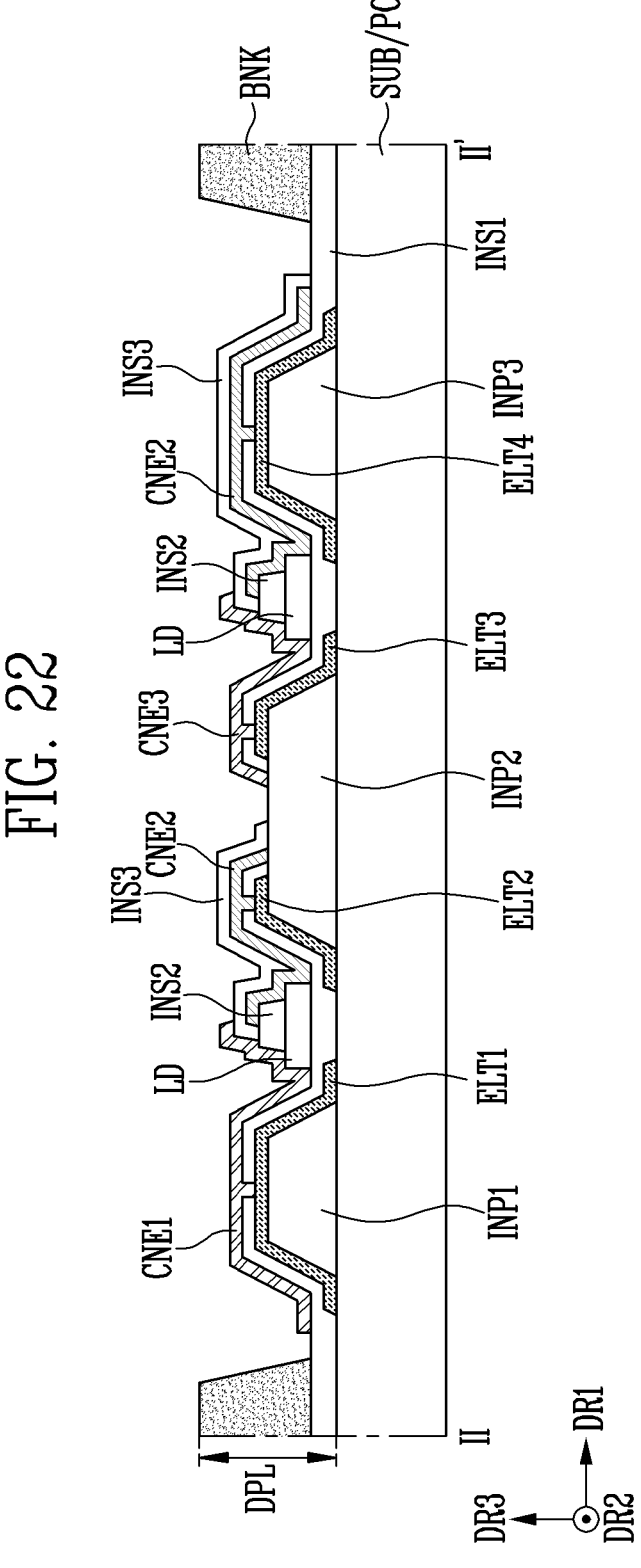

Referring to FIG. 22, the second insulating layer INS2 may be disposed on the light emitting element LD, and first to third contact electrodes CNE1 to CNE3 may be formed. According to one or more embodiments, the third insulating layer INS3 may be disposed between the first contact electrode CNE1 and the second contact electrode CNE2 and between the second contact electrode CNE2 and the third contact electrode CNE3.

According to the described embodiment, after the second contact electrode CNE2 is formed and the third insulating layer INS3 is formed on the second contact electrode CNE2, the first contact electrode CNE1 and the third contact electrode CNE3 may be formed.

Thereafter, although not shown in the drawings, the fourth insulating layer INS4 may be formed on the first to third contact electrodes CNE1 to CNE3 and the bank BNK to provide the display element unit DPL, and the color conversion unit CCL, the optical layer OPL, and the color filter unit CFL may be formed on the display element unit DPL to provide the display device DD according to the described embodiment.

The above description is merely illustrative of the technical spirit of the present disclosure, and various modifications and variations will be possible without departing from the essential characteristics or scope of the present disclosure by those skilled in the art to which the present disclosure pertains. Accordingly, the embodiments of the present disclosure described above may be implemented separately or in combination with each other.

Therefore, the embodiments disclosed in the present disclosure are not intended to limit the technical spirit of the present disclosure, but to illustrate, and the scope of the technical spirit of the present disclosure is not limited by these embodiments. The protection scope of the present disclosure should be construed by the following claims, and all technical ideas within the scope equivalent thereto should be construed as being included in the scope of the present disclosure.

What is claimed is:

1. A display device including a first extension area and a second extension area, the display device comprising:
    a first electrode and a second electrode on a substrate and spaced from each other in a first direction;
    a first light emitting element on the first electrode and the second electrode;
    an upper adjacent electrode spaced from the first electrode in a second direction; and
    a lower adjacent electrode spaced from the first electrode in the second direction,
    wherein:
        the first extension area extends in the first direction and includes a separation area that is directly adjacent to an end of the first electrode with respect to the second direction and in which the first electrode is not located;
        the second extension area extends in the second direction crossing the first direction, the second extension area being an area in which the first electrode and the second electrode are not located;
        the first electrode and the second electrode are between the substrate and the first light emitting element;
        the first extension area includes a 1-1-th extension area and a 1-2-th extension area;
        the first electrode is located between the 1-1-th extension area and the 1-2-th extension area, and the second electrode overlaps the 1-1-th extension area and the 1-2-th extension area when viewed in a plan view;
        the separation area comprises a first separation area and a second separation area, the first separation area is formed in the 1-1-th extension area and between the first electrode and the upper adjacent electrode, the second separation area is formed in the 1-2-th extension area and between the first electrode and the lower adjacent electrode; and
        the first separation area and the second separation area overlap in the second direction when viewed in a plan view.

2. The display device of claim 1, wherein:
    the first extension area and the second extension area overlap in an overlapping area when viewed in a plan view, and form a lattice structure using the overlapping area as a lattice point.

3. The display device of claim 1, wherein:
    a portion of the second electrode that overlaps with the first extension area overlaps with the separation area in the first direction.

4. The display device of claim 1, wherein:
    the second extension area includes a 2-1-th extension area, a 2-2-th extension area, and a 2-3-th extension area;
    the 2-3-th extension area is located between the 2-1-th extension area and the 2-2-th extension area; and
    the first electrode is located between the 2-1-th extension area and the 2-3-th extension area, and the second electrode is located between the 2-2-th extension area and the 2-3-th extension area.

5. The display device of claim 1, wherein:
    the upper adjacent electrode is not located in the first extension area and the second extension area; and
    the upper adjacent electrode, the lower adjacent electrode, the first electrode, and the second electrode are disposed in a same layer.

6. The display device of claim 1, further comprising a first pixel area, a second pixel area, and a third pixel area in which the first light emitting element is located, wherein the first pixel area from which light of a first color is emitted, the second pixel area from which light of a second color is emitted, and the third pixel area from which light of a third color is emitted; and
    wherein the first extension area does not overlap the first pixel area, the second pixel area, and the third pixel area in a plan view.

7. The display device of claim 6, wherein at least a portion of the second extension area overlaps the first pixel area, the second pixel area, and the third pixel area in a plan view.

8. The display device of claim 1, further comprising:
    a third electrode on the substrate and spaced from the second electrode in the first direction; a fourth electrode on the substrate and spaced from the third electrode in the first direction; and a second light emitting element located on the third electrode and the fourth electrode, wherein:
    the fourth electrode is not located in the first extension area and the second extension area; and
    the third electrode overlaps the first extension area and is not located in the second extension area when viewed in a plan view.

9. The display device of claim 8, further comprising:
    a first contact electrode electrically connecting the first electrode and the first light emitting element;
    a second contact electrode electrically connecting the second electrode and the first light emitting element, and electrically connecting the fourth electrode and the second light emitting element; and
    a third contact electrode electrically connecting the third electrode and the second light emitting element.

10. The display device of claim 6, further comprising:
    a color conversion unit comprising a wavelength conversion pattern configured to change a wavelength of light, and defining the first pixel area, the second pixel area, and the third pixel area.

11. An electronic device comprising the display device of claim 1.

* * * * *